United States Patent
Ogawa et al.

(10) Patent No.: US 11,244,978 B2
(45) Date of Patent: Feb. 8, 2022

(54) PHOTOELECTRIC CONVERSION APPARATUS AND EQUIPMENT INCLUDING THE SAME

(71) Applicant: CANON KABUSHIKI KAISHA, Tokyo (JP)

(72) Inventors: Toshiyuki Ogawa, Abiko (JP); Sho Suzuki, Machida (JP); Takehito Okabe, Yokohama (JP); Mitsuhiro Yomori, Tama (JP); Yukinobu Suzuki, Koza-gun (JP); Akihiro Kawano, Yokohama (JP); Tsutomu Tange, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/600,753

(22) Filed: Oct. 14, 2019

(65) Prior Publication Data

US 2020/0127030 A1    Apr. 23, 2020

(30) Foreign Application Priority Data

Oct. 17, 2018  (JP) .............................. JP2018-196075
Feb. 15, 2019  (JP) .............................. JP2019-025790
(Continued)

(51) Int. Cl.
*H01L 27/146*    (2006.01)
*H04N 5/369*    (2011.01)

(52) U.S. Cl.
CPC .. *H01L 27/14623* (2013.01); *H01L 27/14627* (2013.01); *H01L 27/14685* (2013.01);
(Continued)

(58) Field of Classification Search
CPC ......... H01L 27/14623; H01L 27/14627; H01L 27/14685; H01L 27/14634; H01L 27/1464;
(Continued)

(56) References Cited

U.S. PATENT DOCUMENTS 7,382,011 B2    6/2008 Noda et al.
7,679,117 B2    3/2010 Noda et al.
(Continued)

FOREIGN PATENT DOCUMENTS

JP    2005-294647 A    10/2005
JP    2007-013061 A    1/2007
(Continued)

OTHER PUBLICATIONS

Search Report dated Feb. 27, 2020, in European Patent Application No. 19203195.3.
(Continued)

*Primary Examiner* — Shahbaz Nazrul
(74) *Attorney, Agent, or Firm* — Venable LLP

(57) ABSTRACT

Photoelectric conversion apparatus includes semiconductor layer in which first photoelectric converters are arranged in light-receiving region and second photoelectric converters are arranged in light-shielded region, light-shielding wall arranged above the semiconductor layer and defining apertures respectively corresponding to the first photoelectric converters, and light-shielding film arranged above the semiconductor layer. The light-shielding film includes first portion extending along principal surface of the semiconductor layer to cover the second photoelectric converters. The first portion has lower surface and upper surface. The light-shielding wall includes second portion whose distance from the semiconductor layer is larger than distance between the upper surface and the principal surface. Thickness of the
(Continued)

first portion in direction perpendicular to the principal surface is larger than thickness of the second portion in direction parallel to the principal surface.

25 Claims, 22 Drawing Sheets

(30) Foreign Application Priority Data

Feb. 28, 2019 (JP) .............................. JP2019-036672
Jul. 5, 2019 (JP) .............................. JP2019-126403

(52) U.S. Cl.
CPC ......... *H04N 5/369* (2013.01); *H01L 27/1464* (2013.01); *H01L 27/1469* (2013.01); *H01L 27/14634* (2013.01)

(58) Field of Classification Search
CPC ........... H01L 27/1469; H01L 27/14629; H01L 27/14636; H01L 27/14643; H04N 5/369
See application file for complete search history.

(56) References Cited

U.S. PATENT DOCUMENTS

| | | | |
|---|---|---|---|
| 7,993,951 B2 | 8/2011 | Okabe et al. | |
| 8,492,864 B2 | 7/2013 | Watanabe | |
| 8,729,450 B2 | 5/2014 | Yoshitsugu | |
| 8,823,853 B2 | 9/2014 | Kawano | |
| 8,907,262 B2 | 12/2014 | Yamaguchi | |
| 9,006,018 B2 | 4/2015 | Watanabe | |
| 9,653,502 B2 | 5/2017 | Yoshitsugu | |
| 9,923,023 B2 | 3/2018 | Ishino et al. | |
| 10,008,528 B2 | 6/2018 | Ikakura et al. | |
| 10,204,943 B2 | 2/2019 | Suzuki et al. | |
| 10,319,765 B2 | 6/2019 | Kato et al. | |
| 2006/0060899 A1 | 3/2006 | Hong et al. | |
| 2007/0210395 A1 | 9/2007 | Maruyama et al. | |
| 2009/0184386 A1 | 7/2009 | Kobayashi et al. | |
| 2009/0189236 A1 | 7/2009 | Hayashi et al. | |
| 2010/0001178 A1 | 1/2010 | Koshiba | |
| 2010/0201834 A1 | 8/2010 | Maruyama et al. | |
| 2010/0245637 A1 | 9/2010 | Itonaga | |
| 2011/0025872 A1 | 2/2011 | Oshiyama et al. | |
| 2011/0175187 A1 | 7/2011 | Ueno et al. | |
| 2011/0227182 A1 | 9/2011 | Aoki | |
| 2011/0241148 A1 | 10/2011 | Hiyama et al. | |
| 2012/0188431 A1 | 7/2012 | Takimoto | |
| 2013/0001724 A1 | 1/2013 | Masuda | |
| 2013/0214371 A1 | 8/2013 | Asatsuma et al. | |
| 2014/0044390 A1 | 2/2014 | Naruse | |
| 2014/0054662 A1 | 2/2014 | Yanagita et al. | |
| 2014/0071244 A1* | 3/2014 | Hirota | H04N 13/204 348/46 |
| 2014/0346628 A1 | 11/2014 | Okazaki | |
| 2015/0091122 A1 | 4/2015 | Okazaki et al. | |
| 2015/0264233 A1 | 9/2015 | Chien et al. | |
| 2015/0325606 A1 | 11/2015 | Togashi et al. | |
| 2016/0013233 A1 | 1/2016 | Noudo et al. | |
| 2017/0251156 A1 | 8/2017 | Kudoh et al. | |
| 2017/0287956 A1 | 10/2017 | Tezuka | |
| 2017/0338265 A1* | 11/2017 | Yoshiba | H04N 9/04557 |
| 2018/0286904 A1 | 10/2018 | Tazoe et al. | |
| 2018/0374886 A1 | 12/2018 | Iwata et al. | |
| 2019/0259801 A1 | 8/2019 | Seto et al. | |
| 2019/0267421 A1 | 8/2019 | Suzuki et al. | |

FOREIGN PATENT DOCUMENTS

| | | | |
|---|---|---|---|
| JP | 2007-141873 | A | 6/2007 |
| JP | 2009-272747 | A | 11/2009 |
| JP | 2009-283482 | A | 12/2009 |
| JP | 2011-035204 | A | 2/2011 |
| JP | 2011-082386 | A | 4/2011 |
| JP | 2012-084693 | A | 4/2012 |
| JP | 2012-124213 | A | 6/2012 |
| JP | 2012-191005 | A | 10/2012 |
| JP | 2013-012506 | A | 1/2013 |
| JP | 2013-168468 | A | 8/2013 |
| JP | 2014-036037 | A | 2/2014 |
| JP | 2016-062998 | A | 4/2016 |
| JP | 2016-167773 | A | 9/2016 |
| JP | 2016-219551 | A | 12/2016 |
| WO | 2013/150839 | A1 | 10/2013 |
| WO | 2016/114154 | A1 | 7/2016 |

OTHER PUBLICATIONS

U.S. Appl. No. 16/601,888, filed Oct. 15, 2019 (First Named Inventor: Sho Suzuki).
U.S. Appl. No. 16/597,973, filed Oct. 10, 2019 (First Named Inventor: Takumi Ogino).
Office Action dated Mar. 5, 2021, in Japanese Patent Application No. 2019-126403.
Office Action dated Oct. 25, 2021, in Japanese Patent Application No. 2019-126403.

* cited by examiner

PHOTOELECTRIC CONVERSION APPARATUS AND EQUIPMENT INCLUDING THE SAME

BACKGROUND OF THE INVENTION

Field of the Invention

The present invention relates to a photoelectric conversion apparatus and equipment including the same.

Description of the Related Art

A photoelectric conversion apparatus can normally include a light-shielded pixel region (optical black region) in addition to a light-receiving pixel region (effective pixel region). Light-shielded pixels arranged in the light-shielded pixel region are shielded by a light-shielding film, and can be used to detect an optical black level (black level). WO2016/114154 describes a light-shielding structure formed by an OPB forming film arranged in an OPB region outside a pixel effective region, the first light-shielding wall arranged on the OPB forming film, and the second light-shielding wall arranged on the first light-shielding wall.

If light shielding of the light-shielded pixels is insufficient, the black level may vary, influencing the image capturing performance. If the thickness of the light-shielding structure in the light-receiving pixel region becomes large, light beams to enter light-receiving pixels are blocked by the light-shielding structure, resulting in a decrease in sensitivity.

SUMMARY OF THE INVENTION

The present invention provides a technique advantageous in stabilizing the black level detected by pixels arranged in a light-shielded region while suppressing a decrease in sensitivity of pixels in a light-receiving region.

A first aspect of the present invention provides a photoelectric conversion apparatus including a light-receiving region and a light-shielded region, comprising: a semiconductor layer in which a plurality of first photoelectric converters are arranged in the light-receiving region and a plurality of second photoelectric converters are arranged in the light-shielded region; a light-shielding wall arranged above the semiconductor layer and configured to define a plurality of apertures respectively corresponding to the plurality of first photoelectric converters; and a light-shielding film arranged above the semiconductor layer, the light-shielding film including a first portion extending along a principal surface of the semiconductor layer to cover the plurality of second photoelectric converters, the first portion having a lower surface on a side of the semiconductor layer and an upper surface on an opposite side of the lower surface, and the light-shielding wall including a second portion whose distance from the semiconductor layer is larger than a distance between the upper surface and the principal surface, wherein a thickness of the first portion in a direction perpendicular to the principal surface is larger than a thickness of the second portion in a direction parallel to the principal surface.

A second aspect of the present invention provides a photoelectric conversion apparatus including a light-receiving region and a light-shielded region, comprising: a semiconductor layer in which a plurality of first photoelectric converters are arranged in the light-receiving region and a plurality of second photoelectric converters are arranged in the light-shielded region; a light-shielding wall arranged above the semiconductor layer and configured to define a plurality of apertures respectively corresponding to the plurality of first photoelectric converters; and a light-shielding film arranged above the semiconductor layer, the light-shielding film including a first portion extending along a principal surface of the semiconductor layer to cover the plurality of second photoelectric converters, the first portion having a lower surface on a side of the semiconductor layer and an upper surface on an opposite side of the lower surface, and the light-shielding wall including a second portion whose distance from the semiconductor layer is larger than a distance between the upper surface and the principal surface, wherein a light absorption coefficient of a material forming the light-shielding film is larger than a light absorption coefficient of a material forming the light-shielding wall and/or a light transmittance of the first portion in a direction perpendicular to the principal surface is lower than a light transmittance of the light-shielding wall in a direction parallel to the principal surface.

A third aspect of the present invention provides a photoelectric conversion apparatus including a light-receiving region and a light-shielded region, comprising: a semiconductor layer in which a plurality of first photoelectric converters are arranged in the light-receiving region and a plurality of second photoelectric converters are arranged in the light-shielded region; a light-shielding wall arranged above the semiconductor layer and configured to define a plurality of apertures respectively corresponding to the plurality of first photoelectric converters; and a light-shielding film arranged above the semiconductor layer, the light-shielding film including a first portion extending along a principal surface of the semiconductor layer to cover the plurality of second photoelectric converters, the first portion having a lower surface on a side of the semiconductor layer and an upper surface on an opposite side of the lower surface, and the light-shielding wall including a second portion whose distance from the semiconductor layer is larger than a distance between the upper surface and the principal surface, wherein the first portion is made of aluminum and the second portion is made of tungsten.

A fourth aspect of the present invention provides equipment comprising: a photoelectric conversion apparatus defined in any one of the first to third aspects of the present invention; and at least one of an optical system configured to form an optical image in the photoelectric conversion apparatus and a display apparatus configured to display information obtained by the photoelectric conversion apparatus.

Further features of the present invention will become apparent from the following description of exemplary embodiments with reference to the attached drawings.

DESCRIPTION OF THE EMBODIMENTS

Figure 1A:
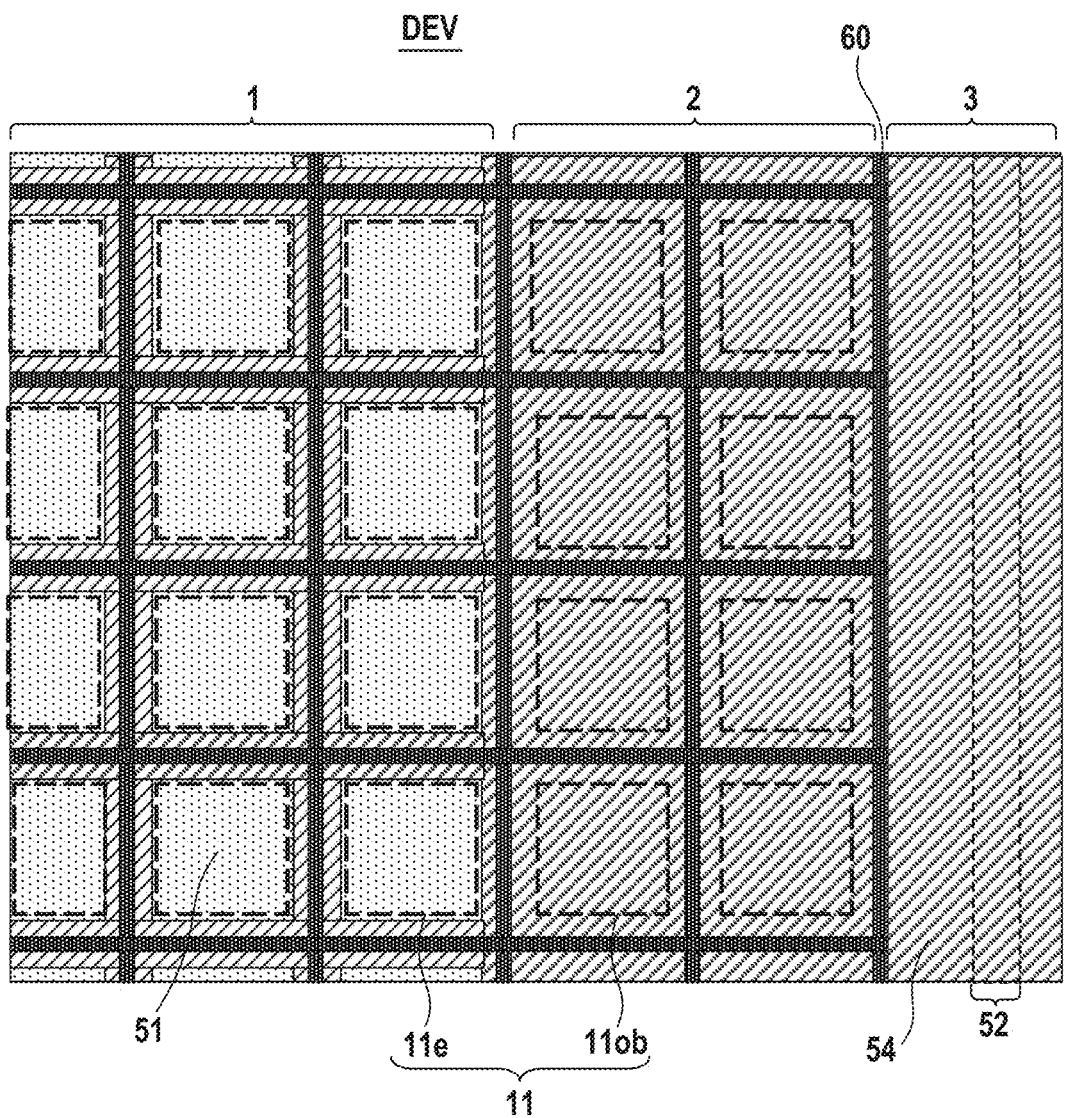
FIGS. 1A and 1B are a plan view and a sectional view each schematically showing the arrangement of a photoelectric conversion apparatus according to the first embodiment.

Embodiments of the present invention will be described in detail below with reference to the accompanying drawings. Note that the following embodiments do not limit the invention according to the scope of the appended claims. Although a plurality of features are described in the embodiments, not all the features are essential to the invention and the plurality of features may arbitrarily be combined. The same reference numerals denote the same or similar parts and a repetitive description thereof will be omitted.

FIG. 1A is a plan view showing the arrangement of some layers of a photoelectric conversion apparatus DEV according to the first embodiment. The photoelectric conversion apparatus DEV can include a light-receiving pixel region 1, a light-shielded pixel region (OB pixel region) 2, and a peripheral circuit region 3. The light-receiving pixel region 1 is a region where a plurality of photoelectric converters (first photoelectric converters) 11e are arranged to form a plurality of rows and a plurality of columns. In other words, the light-receiving pixel region 1 is a region where a plurality of pixels (first pixels) are arranged to form a plurality of rows and a plurality of columns. Signals of the first photoelectric converters (first pixels) 11e of each column of the light-receiving pixel region 1 are output via a column signal line. The light-shielded pixel region 2 is a region where a plurality of shielded photoelectric converters (second photoelectric converters) 11ob are arranged to form a plurality of rows and a plurality of columns. In other words, the light-shielded pixel region 2 is a region where a plurality of shielded pixels (second pixels) are arranged. The plurality of shielded pixels are used to detect a black level, and can be called optical black (OB) pixels. For example, a shock-absorbing region including a pixel structure may be included between the light-receiving pixel region 1 and the light-shielded pixel region 2. The pixels in the light-receiving pixel region 1 and those in the light-shielded pixel region 2 can include, in addition to the photoelectric converters, circuit elements for outputting, outside the pixels, signals corresponding to charges generated in the photoelectric converters.

The peripheral circuit region 3 can include, for example, a row selection circuit, a readout circuit, and a column selection circuit. The plurality of photoelectric converters 11e arranged in the light-receiving pixel region 1 and the plurality of photoelectric converters 11ob arranged in the light-shielded pixel region 2 can be arranged as a whole to form a photoelectric conversion array formed from a plurality of rows and a plurality of columns. In the following description, the photoelectric converters 11e and 11ob will be described as photoelectric converters 11 when it is unnecessary to particularly distinguish between them. The row selection circuit can select a row in the photoelectric conversion array, and drive the photoelectric converters of the selected row. The signals of the photoelectric converters of the row selected by the row selection circuit can be output to the readout circuit via the column signal lines. The readout circuit can read out the signals output to the respective column signal lines. The column selection circuit can sequentially select and output the plurality of signals read out by the readout circuit from the plurality of column signal lines.

Figure 1B:
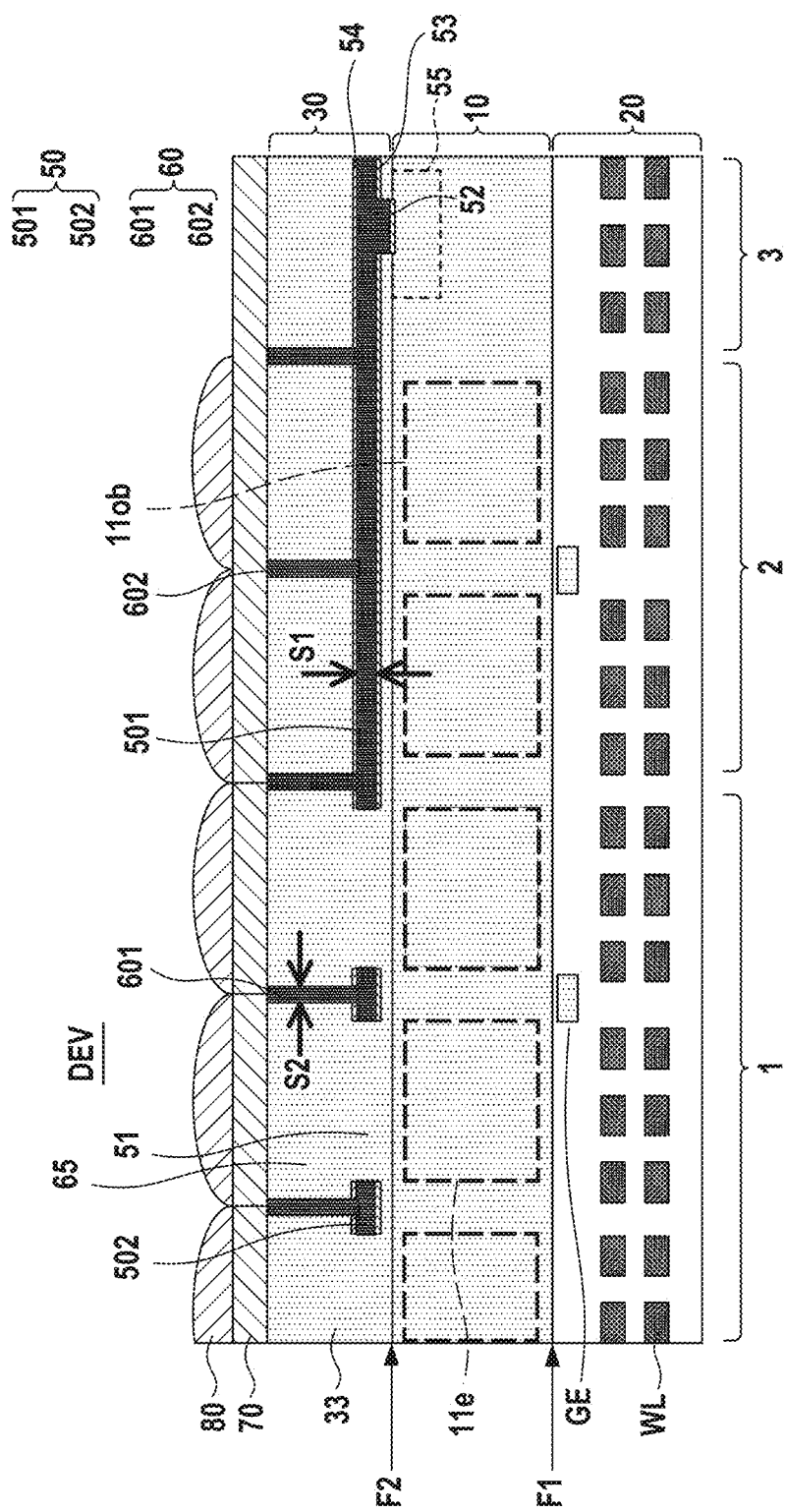

FIG. 1B is a schematic sectional view showing the photoelectric conversion apparatus DEV shown in FIG. 1A. In this specification, the first conductivity type and the second conductivity type will be used as terms to distinguish between an n-type and a p-type. If the first conductivity type is an n-type, the second conductivity type is a p-type, and vice versa. The photoelectric conversion apparatus DEV can include a semiconductor layer 10. The semiconductor layer 10 can be, for example a semiconductor region of the first conductivity type (for example, p-type). In the semiconductor layer 10, a semiconductor region of the first conductivity type and that of the second conductivity type can be arranged. Each of the plurality of photoelectric converters 11 can include a semiconductor region of the second conductivity type forming part of a photodiode. The semiconductor layer 10 includes a first surface F1 and a second surface F2 on the opposite sides. The first surface F1 and the second surface F2 are merely expressions convenient for distinguishing between the two surfaces of the semiconductor layer 10. In this specification, the second surface F2 is regarded as the principal surface.

FIG. 1B shows the photoelectric conversion apparatus DEV formed as a back-side illumination type. However, the photoelectric conversion apparatus DEV may be formed as a front-side illumination type. The photoelectric conversion apparatus DEV can include a wiring structure 20 arranged on the side of the first surface F1 and a partition structure 30 arranged on the side of the second surface F2 (in other words, on the second surface F2 or the principal surface). The first surface F1 can be, for example, an interface between a semiconductor forming the semiconductor layer 10 and an insulator forming part of the wiring structure 20. The second surface F2 can be, for example, an interface between the semiconductor forming the semiconductor layer 10 and an insulator forming part of the partition structure 30. The wiring structure 20 can include, for example, gate electrodes GE of transistors and wiring layers WL. The partition structure 30 can have a structure in which an insulating film 33 is partitioned into a plurality of regions by light-shielding bodies each having a light-shielding property.

The photoelectric conversion apparatus DEV can also include a color filter layer 70 arranged on the side of the second surface F2 (in other words, on the second surface F2 or the principal surface) and/or a plurality of microlenses 80 (on-chip lenses) arranged on the side of the second surface F2. As schematically shown in FIG. 1B, the color filter layer 70 can be arranged between the plurality of microlenses 80 and the second surface F2. The photoelectric conversion apparatus DEV may further include a plurality of intralayer lenses arranged between the second surface F2 and the color filter layer 70. Light beams can respectively enter the plurality of photoelectric converters 11e through the microlenses 80, the color filter layer 70, the partition structure 30, and the second surface F2. From another viewpoint, light beams can respectively enter the second surface F2 through the microlenses 80, the color filter layer 70, and the partition structure 30.

The partition structure 30 can include a light-shielding wall 60, a light-shielding film 50, and the insulating film 33. The partition structure 30 can have, for example, a structure in which the light-shielding wall 60 and the light-shielding film 50 are buried in the insulating film 33. The light-shielding wall 60 and the light-shielding film 50 can be formed. The light-shielding wall 60 is arranged on the side of the second surface F2 of the semiconductor layer 10 (in other words, on the second surface F2 or the principal surface), and can define a plurality of apertures 65 respectively corresponding to the plurality of first photoelectric converters 11e in the light-receiving pixel region 1. From another viewpoint, the light-shielding wall 60 includes a plurality of apertures 51 respectively corresponding to the plurality of first photoelectric converters 11e in the light-receiving pixel region 1.

The light-shielding wall 60 may also be arranged in the light-shielded pixel region 2, and a portion 602, arranged in the light-shielded pixel region 2, of the light-shielding wall 60 can have a structure similar to that of a portion 601, arranged in the light-receiving pixel region 1, of the light-shielding wall 60. For example, the thickness (the thickness in a direction parallel to the second surface F2) of the portion 602, arranged in the light-shielded pixel region 2, of the light-shielding wall 60 can be equal to a thickness S2 (the thickness in a direction parallel to the second surface F2) of the portion 601, arranged in the light-receiving pixel region 1, of the light-shielding wall 60. The array pitch of the apertures 65 in the portion 602, arranged in the light-shielded pixel region 2, of the light-shielding wall 60 can be equal to the array pitch of the apertures 65 in the portion 601, arranged in the light-receiving pixel region 1, of the light-shielding wall 60. The thickness S2 of the light-shielding wall 60 may be expressed as a thickness in a direction perpendicular to the wall surface of the light-shielding wall 60 (the surface of the light-shielding wall 60 facing the apertures 65). The light-shielding wall 60 can be arranged to form a matrix (for example, a rectangular matrix). The light-shielding wall 60 may or may not be provided in the peripheral circuit region 3.

The light-shielding wall 60 can include a portion arranged between the first photoelectric converter 11e arranged at a position closest to the light-shielded pixel region 2 among the plurality of first photoelectric converters 11e and the second photoelectric converter 11ob arranged at a position closest to the light-receiving pixel region 1 among the plurality of second photoelectric converters 11ob in the orthographic projection (to also be referred to as a planar view) to the second surface F2. This portion is effective to prevent light beams entering the insulating film 33 in the light-shielded pixel region 2 from entering the first photoelectric converter 11e in the light-receiving pixel region 1.

The light-shielding film 50 is arranged on the side of the second surface F2 of the semiconductor layer 10 (in other words, on the second surface F2 or the principal surface). More specifically, the light-shielding film 50 can be arranged between the light-shielding wall 60 and the second surface F2 of the semiconductor layer 10. The light-shielding film 50 can include a light-shielding portion (to also be referred to as a first portion hereinafter) 501 arranged to extend in parallel to the second surface F2 to cover the plurality of second photoelectric converters in the light-shielded pixel region 2. The light-shielding film 50 may or may not include a light-shielding portion 502 that defines the plurality of apertures 51 respectively corresponding to the plurality of first photoelectric converters 11e in the light-receiving pixel region 1.

A thickness S1 of the light-shielding portion 501 in the direction perpendicular to the second surface F2 can be equal to the thickness of the light-shielding portion 502 in the direction perpendicular to the second surface F2. In other words, the thickness of the light-shielding film 50 in the direction perpendicular to the second surface F2 can be the same in the light-receiving pixel region 1 and the light-shielded pixel region 2. The light-shielding portion 502 in the light-receiving pixel region 1 and the light-shielding portion 501 in the light-shielded pixel region 2 can be formed at the same time. If the thickness of the light-shielding portion 501 in the light-shielded pixel region 2 is made larger to suppress a variation in black level, the thickness of the light-shielding portion 502 in the light-receiving pixel region 1 also becomes larger, and thus the sensitivity of the photoelectric converters 11e may decrease. The light-shielding portion 502 and the light-shielding wall 60 can be arranged to overlap each other. The light-shielding portion 501 and the light-shielding wall 60 can be arranged to overlap each other. Alternatively, instead of providing the light-shielding portion 502, the lower end of the portion 601, arranged in the light-receiving pixel region 1, of the light-shielding wall 60 may be extended.

In the light-receiving pixel region 1, light beams enter the first photoelectric converters 11e through the insulating film 33 existing in the apertures 65 and 51. In the light-shielded pixel region 2, light beams are shielded or attenuated by the light-shielding film 50 (light-shielding portion 501). That is, the second photoelectric converters 11ob in the light-shielded pixel region 2 are shielded by the light-shielding film 50 (light-shielding portion 501). Note that light shielding can mean not only completely shielding light coming to a target object but also attenuating the light.

The light-shielding wall 60 includes a surface (to be defined as the lower surface of the light-shielding wall 60) on the side of the second surface F2 and a surface (to be defined as the upper surface of the light-shielding wall 60) on the opposite side of the lower surface. The light-shielding film 50 includes a surface (to be defined as the lower surface of the light-shielding film 50) on the side of the second surface F2 and a surface (to be defined as the upper surface of the light-shielding film 50) on the opposite side of the lower surface. The distance between the second surface F2 and the lower surface of the light-shielding wall 60 is equal to or larger than that between the second surface F2 and the upper surface of the light-shielding film 50. Alternatively, a concave portion may be formed on the upper surface of the light-shielding film 50 and part of the light-shielding wall 60 may be arranged in the concave portion. The light-shielding wall 60 can include a portion (to also be referred to as the second portion hereinafter) in which the distance from the semiconductor layer 10 is larger than that between the second surface (principal surface) F2 and the upper surface of the light-shielding film 50. The second portion can be the whole portion 601 or part of it. The second portion may include the whole portion 602 or part of it.

The light-shielding wall 60 and the light-shielding film 50 can be made of materials which have low light transmittances and are easy to process. The light-shielding wall 60 and the light-shielding film 50 can be made of, for example, metal materials. The light-shielding wall 60 and the light-shielding film 50 may be made of the same metal material or different metal materials. The light-shielding wall 60 can be made of, for example, tungsten, aluminum, titanium, tantalum, or copper, and the light-shielding film 50 can be made of, for example, tungsten, aluminum, titanium, tantalum, or copper. In one example, the light-shielding wall 60 and the light-shielding film 50 can be made of tungsten.

The light-shielding film 50 and the semiconductor layer 10 can be electrically connected by a connecting portion 52. Alternatively, the semiconductor layer 10 can include a semiconductor region 55 of a predetermined conductivity type, and the light-shielding film 50 and the semiconductor region 55 can electrically be connected by the connecting portion 52. The semiconductor region 55 and the light-shielding film 50 can be maintained at a predetermined potential. The semiconductor region 55 can be arranged in a region different from the light-receiving pixel region 1 and the light-shielded pixel region 2, for example, in the peripheral circuit region 3. In other words, the light-shielding film 50 and the semiconductor region 55 can electrically be connected by a region different from the light-shielded pixel region 2. Furthermore, the light-shielding wall 60 and the light-shielding film 50 can also electrically be interconnected.

A barrier film 53 can be arranged between the light-shielding film 50 and the insulating film 33. The barrier film 53 can be arranged to contact the lower surface of the light-shielding film 50. A barrier film 53 is also arranged between the connecting portion 52 and the semiconductor layer 10. The barrier film 53 can include, for example, a silicon compound layer and a metal compound layer located between the silicon compound layer and the semiconductor layer 10. The metal compound layer can contain at least one of an oxide, nitride, and carbide of aluminum, titanium, tantalum, hafnium, zirconium, or magnesium. Alternatively, the barrier film 53 can be formed by a metal film of titanium or tantalum and/or a metal compound film of titanium nitride or tantalum nitride. An antireflection film 54 can be arranged above the upper surface of the light-shielding film 50. The antireflection film 54 can reduce stray light to the light-receiving pixel region 1. The antireflection film 54 can be formed by, for example, a dielectric film such as a silicon nitride film and/or a silicon oxynitride film.

The connecting portion 52, the light-shielding film 50, and the light-shielding wall 60 can be formed by the following method. First, the first insulating layer forming part of the insulating film 33 can be formed to cover the second surface F2, and then an opening can be formed at a position where the connecting portion 52 is to be formed in the first insulating layer. Next, a barrier film material for forming the barrier film 53 can be deposited to cover the first insulating layer, and a light-shielding film material and an antireflection film material are deposited to cover the first insulating layer. At this time, the opening formed in the first insulating layer can be filled with the light-shielding film material to form the connecting portion 52. Then, the first light-shielding film material and the antireflection film material are patterned to form the plurality of apertures 51, thereby forming the light-shielding film 50 and the antireflection film 54. Next, the second insulating layer forming part of the insulating film 33 can be deposited by spattering or the like to cover the light-shielding film 50 and the first insulating layer. The second insulating layer can be patterned to form a concave portion for forming the light-shielding wall 60, and the concave portion can be filled with the light-shielding wall material to form the light-shielding wall 60.

Figure 2:
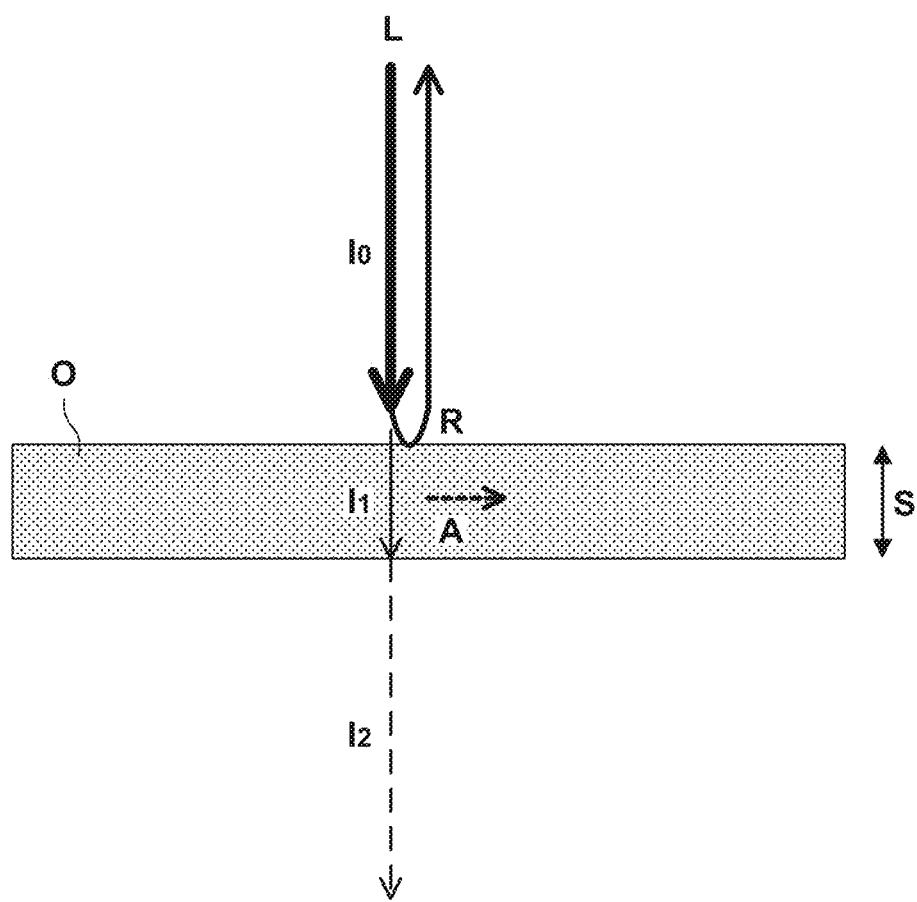
FIG. 2 is a view for explaining a light absorption coefficient and a light transmittance.

A light absorption coefficient and a light transmittance will be described below with reference to FIG. 2. A target object which light enters is assumed to be an object O. When discussing the light absorption coefficient and light transmittance of the light-shielding film 50, the object O is replaced by the light-shielding film 50. When discussing the light absorption coefficient and light transmittance of the light-shielding wall 60, the object O is replaced by the light-shielding wall 60.

The object O is made of a material M and has a thickness S, and the light absorption coefficient of the material M is represented by a. Assume that light L vertically enters the surface of the object O. The light is reflected by the surface of the object O. Let R be the reflectance of the light on the surface of the object O. The light is absorbed in the object O. Let A be the light absorptance in the object O.

When $I_0$ represents the intensity of the entering the surface of the object O, intensity $I_1$ of light reaching the inside of the object O and intensity $I_2$ of light having passed through the back surface of the object O are given by:

$$I_1 = I_0(1-R)$$

$$I_2 = I_1(1-A) = I_0(1-R)(1-A)$$

The ratio between the intensity $I_2$ of the light having passed through the back surface of the object O and the intensity $I_0$ of the light entering the surface of the object O is given, as a transmittance T, by:

$$T = I_2/I_0$$

The reflectances R and light absorptances A of tungsten (W), copper (Cu), and aluminum (Al) are as follows.

<Reflectance (R)>
  W, Cu: 0.5-0.6
  Al: 0.7-0.75
<Light Absorptance (A) (Thickness=0.2 μm)>
  W, Cu, Al: >0.99999

When the light-shielding performance requested in the light-shielded pixel region 2 is represented by the light transmittance, it is, for example, −200 db or higher. Since it is difficult to achieve the above light-shielding performance only by reflection, it is necessary to achieve the above light-shielding performance by light absorption. The light absorptance A is decided based on the thickness S of the object O and the light absorption coefficient α of the material M forming the object O, and is given by:

$$A=\exp[\alpha S]$$

If the material M is already decided, the light absorptance A is decided based on the thickness S of the object O. In the first embodiment shown in FIGS. 1A and 1B, the light-shielding performance of the light-shielded pixel region 2 is decided based on the light absorptance A of the light-shielding film 50. This is because the light-shielding film 50 covers the photoelectric converters 11ob and light enters the light-shielding film 50 at an angle perpendicular to the upper surface of the light-shielding film 50. Therefore, it is necessary to increase the thickness S1 of the light-shielding film 50 to increase the absorptance of the light-shielding film 50.

The distance between the second surface F2 and the light-shielding wall 60 is larger than that between the second surface F2 and the light-shielding film 50, and the incident angle of light with respect to the wall surface of the light-shielding wall 60 (a surface facing the insulating film 33) is not 0° (the wall surface and the light incident direction are not perpendicular to each other). Thus, increasing the thickness S2 of the light-shielding wall 60 hardly contributes to improvement of the light-shielding performance. To uniformly form the light-shielding wall 60 in the entire light-receiving pixel region 1, the structure of the light-shielding wall 60 needs to be made the same between the light-receiving pixel region 1 and the light-shielded pixel region 2. If the structure of the light-shielding wall 60 is made different between the light-receiving pixel region 1 and the light-shielded pixel region 2, a dimensional difference and the like can be generated between the light-shielding wall 60 near the extension in the light-receiving pixel region 1 and the light-shielding wall 60 in the central portion of the light-receiving pixel region 1. This dimensional difference can cause shading. From this viewpoint, increasing the thickness S2 of the light-shielding wall 60 lowers the sensitivity of the photoelectric converters 11e in the light-receiving pixel region 1.

Therefore, the light-shielding performance in the light-shielded pixel region 2 is advantageously improved by increasing the thickness S1 of the light-shielding film 50. To do this, it is advantageous to satisfy S1>S2 by considering, as design parameters, the thickness S2 of the light-shielding wall 60 to be decreased and the thickness S1 of the light-shielding film 50 to be increased. When S1>S2 is satisfied, it is possible to achieve both improvement of the light-shielding performance of the light-shielded pixel region 2 and suppression of a decrease in sensitivity of the photoelectric converters 11e (pixels) in the light-receiving pixel region 1. The improvement of the light-shielding performance of the light-shielded pixel region 2 stabilizes the black level detected by the pixels arranged in the light-shielded pixel region 2. When S1>S2 is satisfied, this means that the thickness of the light-shielding portion 501 of the light-shielding film 50 in the direction perpendicular to the second surface F2 is larger than that of the light-shielding wall 60 in the direction parallel to the second surface F2.

From another viewpoint, it is advantageous that a light transmittance T1 of the light-shielding portion 501 of the light-shielding film 50 in the direction perpendicular to the second surface F2 is lower than a light transmittance T2 of the light-shielding wall 60 in the direction parallel to the second surface F2, that is, T1<T2 is satisfied. When T1<T2 is satisfied, it is possible to achieve both improvement of the light-shielding performance of the light-shielded pixel region 2 and suppression of a decrease in the sensitivity of the photoelectric converters 11e (pixels) in the light-receiving pixel region 1.

From still another viewpoint, it is also advantageous that a light absorption coefficient α1 of a material forming the light-shielding film 50 is larger than a light absorption coefficient α2 of a material forming the light-shielding wall 60, that is, α1>α2 is satisfied. When α1>α2 is satisfied, this is effective to achieve both improvement of the light-shielding performance of the light-shielded pixel region 2 and suppression of a decrease in sensitivity of the photoelectric converters 11e (pixels) in the light-receiving pixel region 1. However, to satisfy α1>α2, the material forming the light-shielding film 50 and the material forming the light-shielding wall 60 need to be different from each other.

Figure 3A:
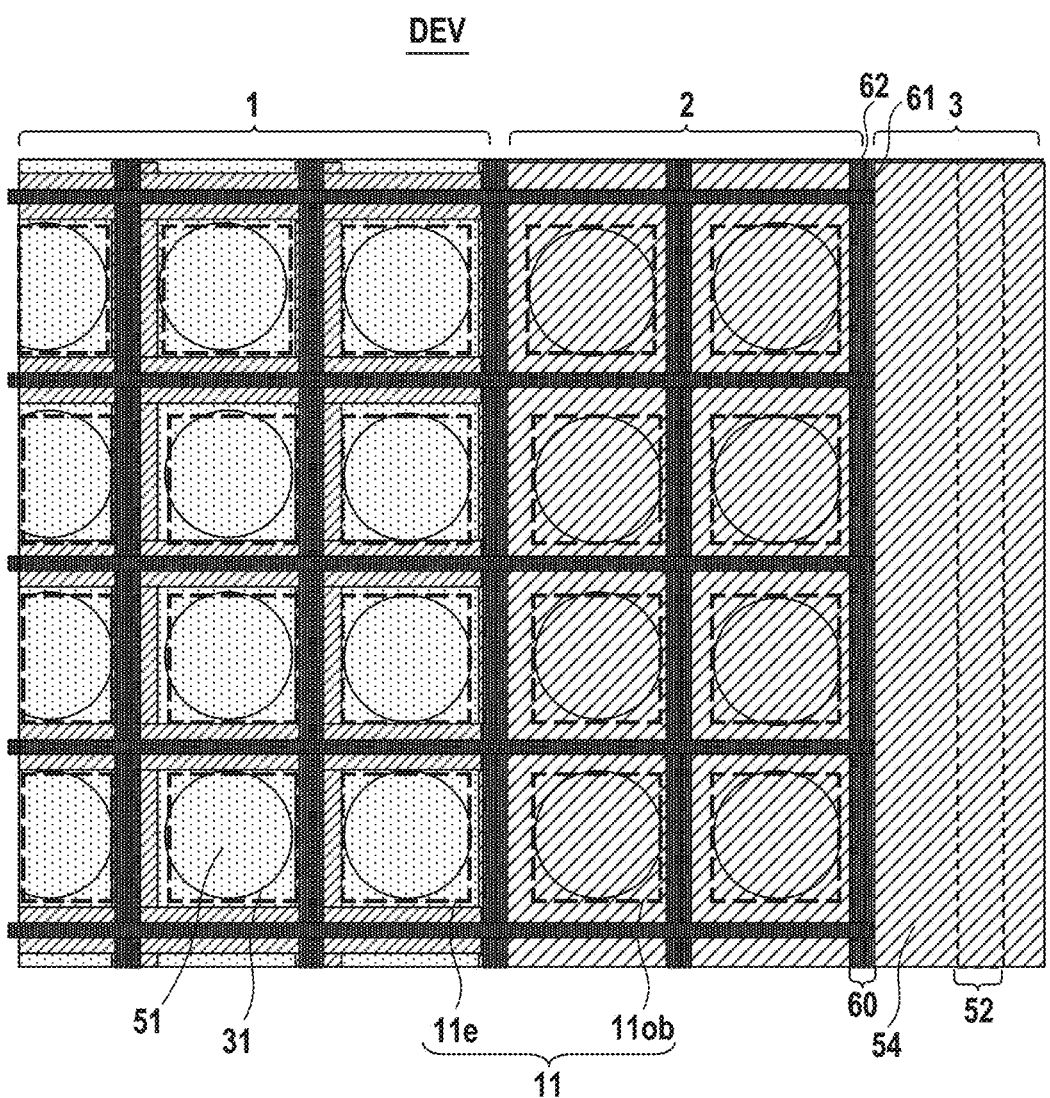
FIGS. 3A and 3B are a plan view and a sectional view each schematically showing the arrangement of a photoelectric conversion apparatus according to the second embodiment.
Figure 3B:
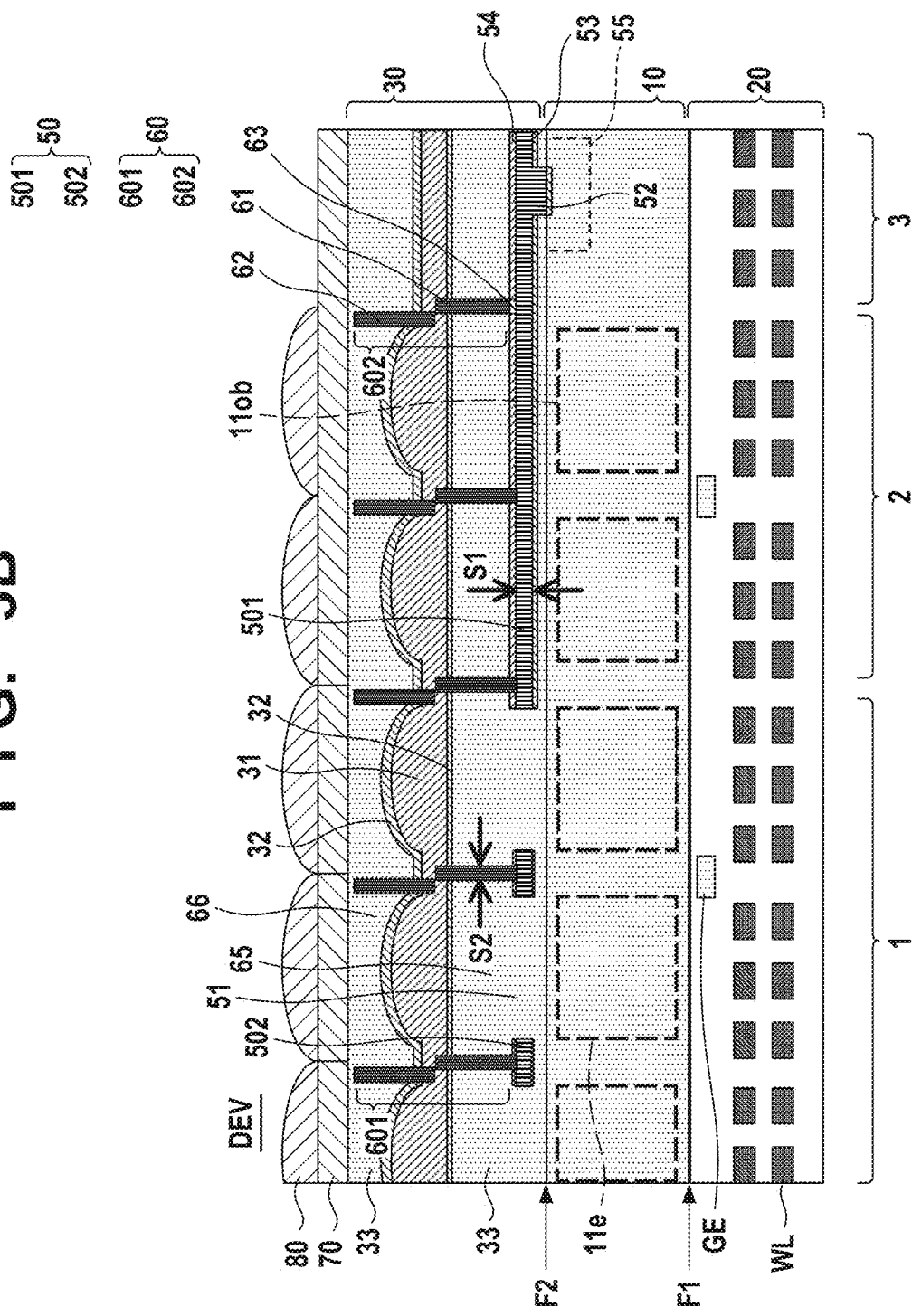

A photoelectric conversion apparatus DEV according to the second embodiment will be described below with reference to FIGS. 3A and 3B. Items which are not referred to as the second embodiment can comply with the first embodiment. FIG. 3A is a plan view showing the arrangement of some layers of the photoelectric conversion apparatus DEV according to the second embodiment. FIG. 3B is a schematic sectional view showing the photoelectric conversion apparatus DEV shown in FIG. 3A. In the second embodiment as well, the fact that at least one of conditions of S1>S2, T1<T2, and α1>α2 is satisfied is advantageous in achieving both improvement of the light-shielding performance of a light-shielded pixel region 2 and suppression of a decrease in sensitivity of photoelectric converters 11e in a light-receiving pixel region 1.

As shown in FIG. 3B, in the photoelectric conversion apparatus DEV according to the second embodiment, a light-shielding wall 60 can include a first light-shielding wall layer 61 including a plurality of apertures 65 and a second light-shielding wall layer 62 stacked on the first light-shielding wall layer 61 and including a plurality of apertures 66. The light-shielding wall 60 may be formed by stacking more light-shielding wall layers. In other words, the light-shielding wall 60 can be formed by a plurality of stacked light-shielding wall layers. This arrangement is advantageous especially when the thickness of a partition structure 30 in a direction orthogonal to a second surface F2 is large. The plurality of light-shielding wall layers can be arranged in a portion of the light-receiving pixel region 1 (for example, a peripheral portion of the light-receiving pixel region 1) in accordance with the direction of an incident light beam so that the positions of the apertures 65 and 66 mutually shift in a direction parallel to the second surface F2. This structure is advantageous in improving the sensitivity and reducing stray light.

The photoelectric conversion apparatus DEV according to the second embodiment can include a plurality of intralayer lenses (on-chip lenses) 31 between a plurality of microlenses 80 and the second surface F2. The plurality of intralayer lenses 31 can be arranged in a boundary portion between the first light-shielding wall layer 61 and the second light-shielding wall layer 62. An end portion (upper end) farther from the second surface F2, out of two end portions on the opposite sides of the first light-shielding wall layer 61 in the direction orthogonal to the second surface F2, can be arranged in concave portions formed in the intralayer lenses 31. An end portion (lower end) closer to the second surface F2, out of two end portions on the opposite sides of the second light-shielding wall layer 62 in the direction orthogonal to the second surface F2, can be arranged in the concave portions formed in the corresponding intralayer lenses 31.

The plurality of intralayer lenses 31 can be arranged in the light-receiving pixel region 1. By arranging the plurality of intralayer lenses 31 in the light-receiving pixel region 1, it is possible to reduce color mixing. The plurality of intralayer lenses 31 can also be arranged in the light-shielded pixel region 2 in addition to being arranged in the light-receiving pixel region 1. By arranging the plurality of intralayer lens 31 in the light-shielded pixel region 2 as well, light entering the first light-shielding wall layer 61 (light-shielding wall 60) can be reduced, thereby improving the light-shielding performance. Arranging the intralayer lenses 31 in the light-receiving pixel region 1 and the light-shielded pixel region 2 is advantageous in uniformly forming the intralayer lenses 31 in the entire light-receiving pixel region 1. Arranging the intralayer lenses 31 in the light-receiving pixel region 1 and the light-shielded pixel region 2 is also advantageous in uniformly forming, in the entire light-receiving pixel region 1, the second light-shielding wall layer 62 to be formed later.

On the other hand, light beams entering the on-chip lenses on the light-shielding film 50 are condensed by arranging the on-chip lenses such as the microlenses 80 and the intralayer lenses 31 on a light-shielding film 50 (light-shielding portion 502). Therefore, the intensity of light entering the light-shielding film 50 is higher than that in a case in which no on-chip lenses are provided on the light-shielding film 50, and the amount of light transmitted through the light-shielding film 50 can become large. Therefore, if on-chip lenses are arranged above the light-shielding film 50, it is more effective to improve the light-shielding performance of the light-shielding film 50. An antireflection film 32 can be provided on at least the lower surfaces (the surfaces on the side of the second surface F2) of the intralayer lenses 31 or the upper surfaces on the opposite side of the lower surfaces.

The material of the light-shielding film 50 and that of the light-shielding wall 60 are not specifically limited. In one example, the light-shielding film 50 can be made of aluminum and the light-shielding wall 60 can be made of tungsten. Since the light absorptance of aluminum is about 2.5 times that of tungsten, if a thickness 51 of the light-shielding film 50 is the same, the light-shielding film 50 made of aluminum has the light-shielding performance which is about 2.5 times that of the light-shielding film 50 made of tungsten.

A barrier film 63 can be arranged between the light-shielding film 50 and the light-shielding wall 60. If the light-shielding film 50 and the light-shielding wall 60 are made of different materials like the case in which the light-shielding film 50 is made of aluminum and the light-shielding wall 60 is made of tungsten, the barrier film 63 is advantageous in stabilizing connection of the light-shielding film 50 and the light-shielding wall 60. If the light-shielding film 50 is made of aluminum and the light-shielding wall 60 is made of tungsten, the barrier film 63 can be formed by a metal compound film of TiN, TaN, or the like and/or a metal film of Ti, Ta, or the like. A material forming the barrier film 63 can be selected in accordance with a combination of the material forming the light-shielding film 50 and the material forming the light-shielding wall 60. In an additional example, the connecting portion 52 may be made of tungsten, and the light-shielding film 50 and the semiconductor layer 10 may be electrically connected via a connecting portion 52 made of tungsten. A contact resistance between the light-shielding film 50 and the semiconductor layer 10 may be lower in a case where the connecting portion 52 is made of tungsten than in a case where the connecting portion 52 is made of aluminum. In this electrical viewpoint, regardless of a material of the light-shielding film 50, tungsten may be better for the connecting portion 52 than aluminum. In an optical viewpoint, aluminum may be better for the light-shielding film 50 than tungsten. Therefore, a combination of the light-shielding film 50 made of aluminum and the connecting portion 52 made of tungsten may provide both of an optical and electrical advantage.

Figure 4:
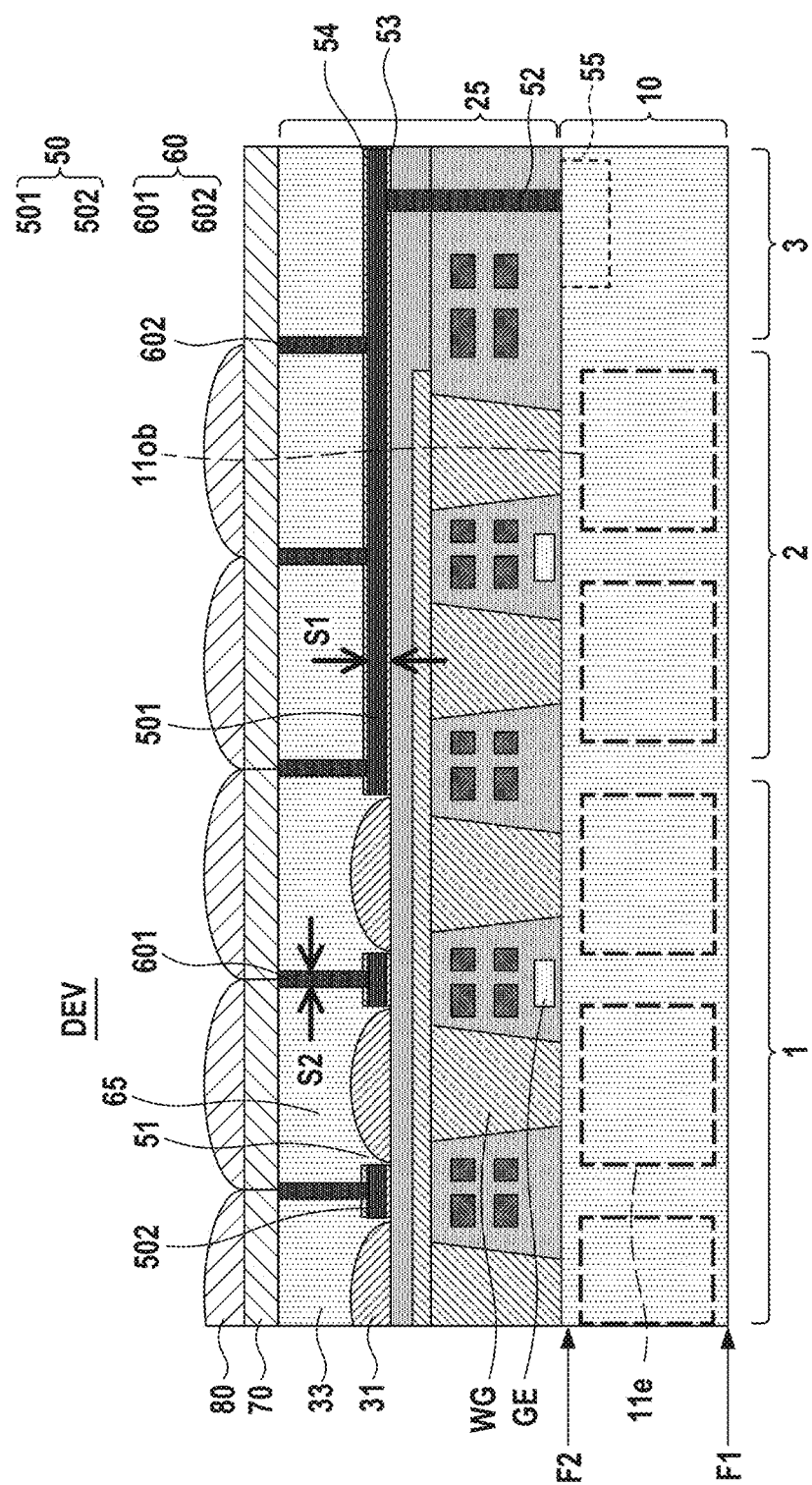
FIG. 4 is a view schematically showing the arrangement of a photoelectric conversion apparatus according to the third embodiment.

A photoelectric conversion apparatus DEV according to third embodiment will be described below with reference to FIG. 4. FIG. 4 is a schematic sectional view showing the photoelectric conversion apparatus DEV according to the third embodiment. Items which are not referred to as the third embodiment can comply with the first or second embodiment. The photoelectric conversion apparatus DEV according to the third embodiment is formed as a front-side illumination type. A semiconductor layer 10 includes a first surface F1 and a second surface F2 on the opposite sides. A wiring structure 25 can be arranged on the side of the second surface F2 of the semiconductor layer 10.

The wiring structure 25 can include, for example, gate electrodes GE of transistors and wiring layers WL. The wiring structure 25 can include an arrangement corresponding to the above-described partition structure 30. The wiring structure 25 may include a plurality of waveguides WG respectively corresponding to a plurality of photoelectric converter 11e in a light-receiving pixel region 1. In this case, the wiring structure 25 may include waveguides WG respectively corresponding to a plurality of photoelectric converters 11ob in a light-shielded pixel region 2. The wiring structure 25 can include a plurality of intralayer lenses 31 respectively corresponding to the plurality of photoelectric converters 11e in the light-receiving pixel region 1 or the plurality of waveguides WG in the light-receiving pixel region 1.

The representative photoelectric conversion apparatus DEV according to each of the first to third embodiments can be formed as an image capturing apparatus that detects an optical image and a light intensity distribution as an electric image signal. As applications of the photoelectric conversion apparatus DEV formed as an image capturing apparatus, electronic equipment such as a camera, smartphone, or general-purpose computer or transportation equipment such as an automobile in which the image capturing apparatus is incorporated will be exemplified. The camera conceptually includes not only an apparatus whose principal purpose is shooting but also an apparatus (for example, a personal computer or a mobile terminal such as a tablet) additionally provided with a shooting function. Note that examples of the equipment incorporating the image capturing apparatus are office equipment such as a copy machine or a scanner, medical equipment for radiation diagnosis or endoscope observation, industrial equipment such as an industrial robot, and analysis equipment such as an electron microscope.

Figure 5:
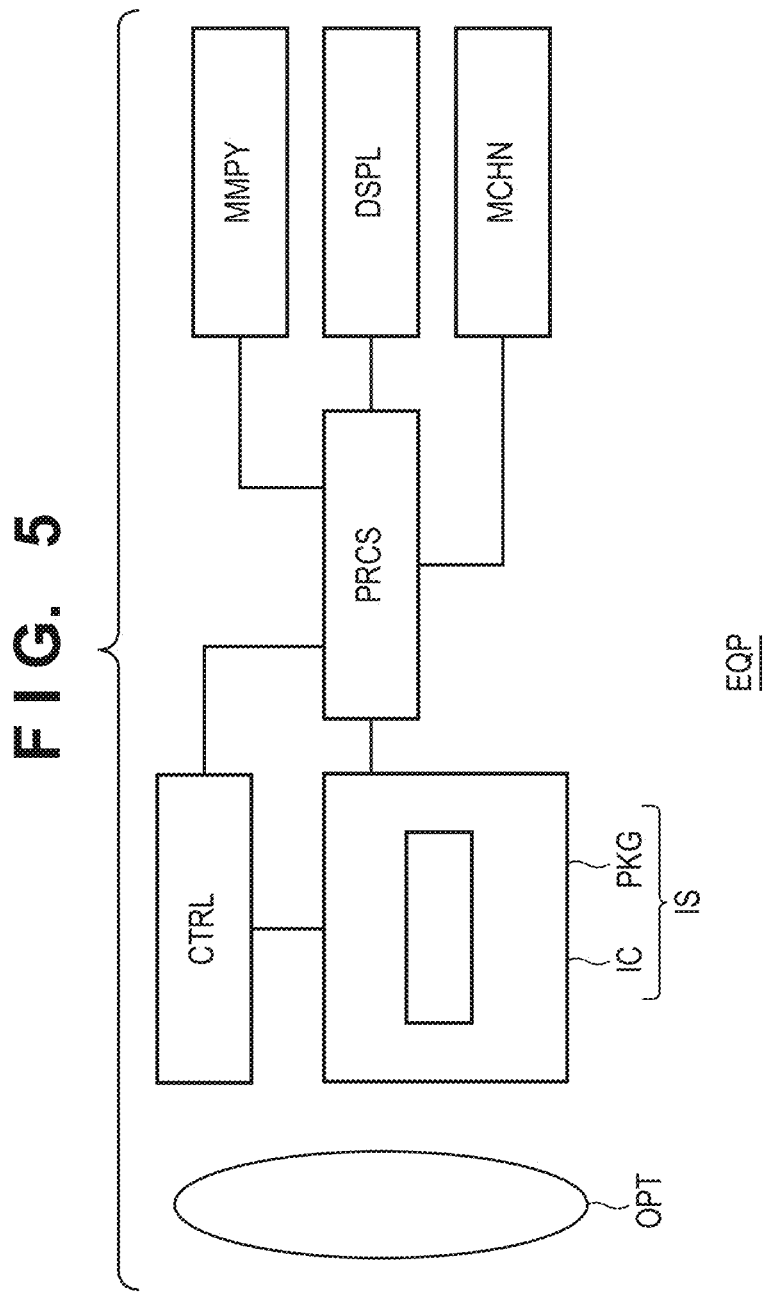
FIG. 5 is a view exemplifying equipment mounted with the photoelectric conversion apparatus.

FIG. 5 is a schematic view showing equipment EQP mounted with the photoelectric conversion apparatus DEV formed as an image capturing apparatus IS. An example of the equipment EQP is electronic equipment (information equipment) such as a camera or smartphone or transportation equipment such as an automobile, ship, or airplane. The image capturing apparatus IS can include a package PKG that stores a semiconductor device IC in addition to the semiconductor device IC including a semiconductor substrate (semiconductor chip). The package PKG can include a base on which the semiconductor device IC is fixed, a lid made of glass or the like facing the semiconductor device IC, and a connection member such as a bonding wire and bump for connecting a terminal of the base and a terminal of the semiconductor device IC. The equipment EQP can further include at least one of an optical system OPT, a control apparatus CTRL, a processing apparatus PRCS, a display apparatus DSPL, and a storage apparatus MMRY. The optical system OPT is a system that forms an optical image on the image capturing apparatus IS and is implemented by, for example, a lens, a shutter, and a mirror. The control apparatus CTRL controls the operation of the image capturing apparatus IS and is, for example, a semiconductor device such as an ASIC. The processing apparatus PRCS processes a signal output from the image capturing apparatus IS and is a semiconductor device such as a CPU or ASIC for forming an AFE (Analog Front End) or a DFE (Digital Front End). The display apparatus DSPL is an EL display apparatus or liquid crystal display apparatus that displays information (image) obtained by the image capturing apparatus IS. The storage apparatus MMRY is a magnetic device or semiconductor device that stores the information (image) obtained by the image capturing apparatus IS. The storage apparatus MMRY is a volatile memory such as an SRAM or DRAM or a nonvolatile memory such as a flash memory or hard disk drive. A mechanical apparatus MCHN includes a moving unit or propulsion unit such as a motor or engine. The mechanical apparatus MCHN in the camera can drive the components of the optical system OPT in order to perform zooming, an in-focus operation, and a shutter operation. The equipment EQP displays the signal output from the image capturing apparatus IS on the display apparatus DSPL and performs external transmission by a communication apparatus (not shown) of the equipment EQP. For this purpose, the equipment EQP may further include the storage apparatus MMRY and the processing apparatus PRCS in addition to the memory circuits and arithmetic circuits included in the control/signal processing circuits in which the image capturing apparatus IS can be incorporated.

Figure 6A:
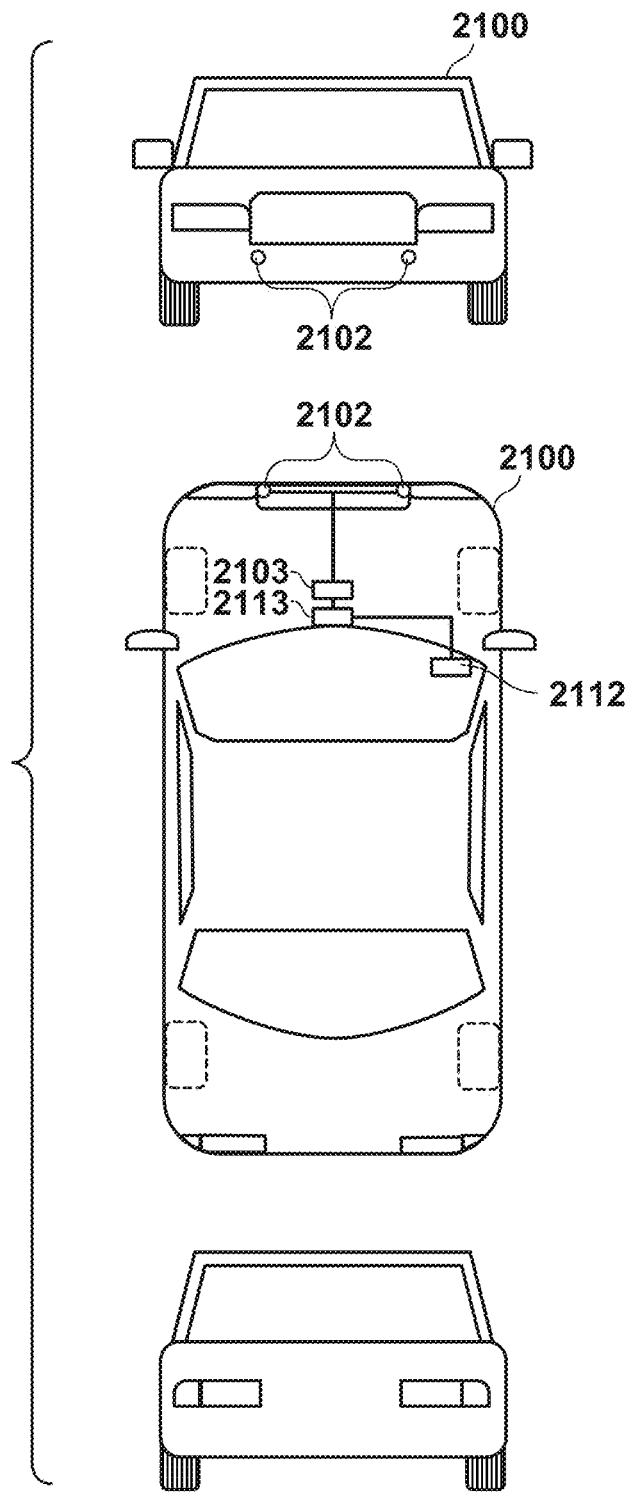
FIGS. 6A and 6B are views exemplifying other equipment mounted with the photoelectric conversion apparatus.

As described above, the photoelectric conversion apparatus DEV is advantageous in improving the light-shielding performance of the light-shielded pixel region 2 and improving the sensitivity of the photoelectric converters 11e (pixels) in the light-receiving pixel region 1. Therefore, a camera incorporating the photoelectric conversion apparatus DEV is suitable as a surveillance camera, an onboard camera mounted in transportation equipment such as an automobile or railroad car, or the like. An example in which the camera incorporating the photoelectric conversion apparatus DEV is applied to transportation equipment will be exemplified. Transportation equipment 2100 can be, for example, an automobile including an onboard camera system 2101 shown in FIGS. 6A and 6B. FIG. 6A schematically shows the outer appearance and the main internal structure of the transportation equipment 2100. The transportation equipment 2100 includes photoelectric conversion apparatuses 2102, an image capturing system integrated circuit (ASIC: Application Specific Integrated Circuit) 2103, a warning apparatus 2112, and a control apparatus 2113.

The above-described photoelectric conversion apparatus DEV is used as each photoelectric conversion apparatus 2102. The warning apparatus 2112 warns a driver when it receives an abnormality signal from an image capturing system, a vehicle sensor, a control unit, or the like. The control apparatus 2113 comprehensively controls the operations of the image capturing system, the vehicle sensor, the control unit, and the like. Note that the transportation equipment 2100 need not include the control apparatus 2113. In this case, the image capturing system, the vehicle sensor, and the control unit each individually include a communication interface and transmit/receive control signals via a communication network (for example, CAN standards).

Figure 6B:
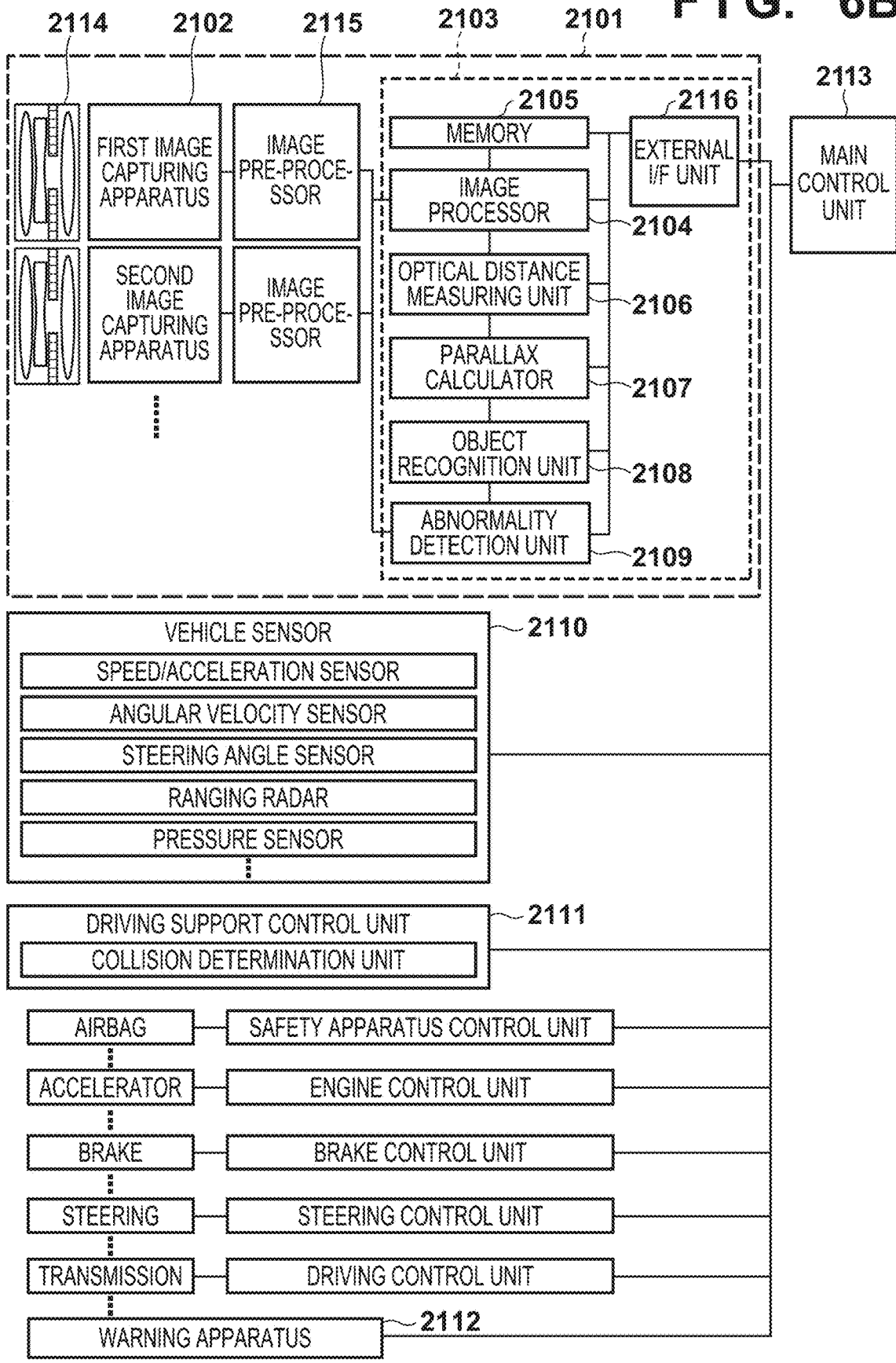

FIG. 6B is a block diagram showing the system arrangement of the transportation equipment 2100. The transportation equipment 2100 includes the first photoelectric conversion apparatus 2102 and the second photoelectric conversion apparatus 2102. That is, the onboard camera according to this embodiment is a stereo camera. An object image is formed by each optical unit 2114 on each photoelectric conversion apparatus 2102. A pixel signal output from each photoelectric conversion apparatus 2102 is processed by an image preprocessor 2115 and transmitted to the image capturing system integrated circuit 2103. The image preprocessor 2115 performs processing such as S-N calculation and synchronization signal addition. A signal processor 902 corresponds to at least part of the image preprocessor 2115 and the image capturing system integrated circuit 2103.

The image capturing system integrated circuit 2103 includes an image processor 2104, a memory 2105, an optical distance measurement unit 2106, a parallax calculation unit 2107, an object recognition unit 2108, an abnormality detection unit 2109, and an external interface (I/F) unit 2116. The image processor 2104 generates an image signal by processing signals output from the pixels of each photoelectric conversion apparatus 2102. The image processor 2104 also performs correction of the image signal and interpolation of an abnormal pixel. The memory 2105 temporarily holds the image signal. The memory 2105 may also store the position of a known abnormal pixel in the photoelectric conversion apparatus 2102. The optical distance measurement unit 2106 uses the image signal to perform focusing or distance measurement of an object. The parallax calculation unit 2107 performs object collation (stereo matching) of a parallax image. The object recognition unit 2108 analyzes the image signal to recognize objects such as transportation equipment, a person, a road sign, and a road. The abnormality detection unit 2109 detects the fault or an error operation of the photoelectric conversion apparatus 2102. When a fault or an error operation is detected, the abnormality detection unit 2109 transmits a signal indicating the detection of an abnormality to the control apparatus 2113. The external I/F unit 2116 mediates exchange of information between the units of the image capturing system integrated circuit 2103 and the control apparatus 2113 or the various kinds of control units.

The transportation equipment 2100 includes a vehicle information acquisition unit 2110 and a driving support unit 2111. The vehicle information acquisition unit 2110 includes vehicle sensors such as a speed/acceleration sensor, an angular velocity sensor, a steering angle sensor, a ranging radar, and a pressure sensor.

The driving support unit 2111 includes a collision determination unit. Based on the pieces of information from the optical distance measurement unit 2106, the parallax calculation unit 2107, and the object recognition unit 2108, the collision determination unit determines whether there is the possibility of a collision with an object. The optical distance measurement unit 2106 and the parallax calculation unit 2107 are examples of distance information acquisition units that acquire distance information of a target object. That is, distance information includes pieces of information concerning the parallax, the defocus amount, the distance to the target object, and the like. The collision determination unit may use one of these pieces of distance information to determine the possibility of a collision. Each distance information acquisition unit may be implemented by specially designed hardware or a software module.

An example in which the driving support unit 2111 controls the transportation equipment 2100 so as to avoid a collision with another object has been described. However, the present invention is also applicable to control for automated driving following another vehicle or automated driving without deviation from a lane.

The transportation equipment 2100 also includes driving apparatuses which are used for movement or for supporting the movement, such as an air bag, an accelerator, a brake, a steering wheel, a transmission, an engine, a motor, wheels, and propellers. The transportation equipment 2100 also includes control units for these apparatuses. Each control unit controls a corresponding driving apparatus based on a control signal of the control apparatus 2113.

The image capturing system used in this embodiment is applicable not only to an automobile and a railroad car but also to, for example, equipment such as a ship, an airplane, or an industrial robot. In addition, the image capturing system is applicable not only to transportation equipment but also to equipment that widely uses object recognition, such as ITS (Intelligent Transportation System).

In this specification, the fact that A is higher than B means that the distance between A and the principal surface of the semiconductor layer is larger than that between B and the principal surface, and the fact that A is lower than B means that the distance between A and the principal surface is smaller than that between B and the principal surface. In this specification, the lower end of A indicates an end on the side of the semiconductor layer out of two ends of A in the direction perpendicular to the principal surface, and the upper end of A indicates an end on the opposite side of the lower end out of the two ends of A in the direction perpendicular to the principal surface. In this specification, the lower surface of A indicates a surface on the side of the semiconductor layer out of two surfaces of A intersecting (or orthogonal to) the direction perpendicular to the principal surface, and the upper surface of A indicates a surface on the opposite side of the lower surface out of the two surfaces of A intersecting (or orthogonal to) the direction perpendicular to the principal surface.

FIG. 7A is a plan view showing the arrangement of a photoelectric conversion apparatus 400 according to the fourth embodiment of the present invention. The photoelectric conversion apparatus 400 includes a light-receiving pixel region 401, a light-shielded pixel region (OB pixel region) 402, and a peripheral circuit region 403. The light-receiving pixel region 401 is a region where a plurality of photoelectric converters (first photoelectric converters) are arranged to form a plurality of rows and a plurality of columns. In other words, the light-receiving pixel region 401 is a region where a plurality of pixels (first pixels) are arranged to form a plurality of rows and a plurality of columns. Signals of the first photoelectric converters (first pixels) of each column of the light-receiving pixel region 401 are output via a column signal line. The light-shielded pixel region 402 is a region where a plurality of shielded photoelectric converters (second photoelectric converters) are arranged to form a plurality of rows and a plurality of columns. In other words, the light-shielded pixel region 402 is a region where a plurality of shielded pixels (second pixels) are arranged. The plurality of shielded pixels are used to provide an optical black level, and can be called optical black (OB) pixels. A shock-absorbing region including a pixel structure may be included between the light-receiving pixel region 401 and the light-shielded pixel region 402. The pixels in the light-receiving pixel region 401 and those in the light-shielded pixel region 402 include, in addition to the photoelectric converters, circuit elements for outputting, outside the pixels, signals corresponding to charges generated in the photoelectric converters.

The peripheral circuit region 403 can include, for example, a row selection circuit, a readout circuit, and a column selection circuit. The plurality of photoelectric converters arranged in the light-receiving pixel region 401 and the plurality of photoelectric converters arranged in the light-shielded pixel region 402 can be arranged as a whole to form a photoelectric conversion array formed from a plurality of rows and a plurality of columns. The row selection circuit selects a row in the photoelectric conversion array, and drives the photoelectric converters of the selected row. The signals of the photoelectric converters of the row selected by the row selection circuit are output to the readout circuit via the column signal lines. The readout circuit reads out the signals output to each column signal line. The column selection circuit sequentially selects and outputs the plurality of signals read out by the readout circuit from the plurality of column signal lines.

FIG. 7B is a schematic sectional view taken along a line A-A of the photoelectric conversion apparatus 400 in FIG. 7A. In the following description, the first conductivity type and the second conductivity type will be used as terms to discriminate between an n-type and a p-type. If the first conductivity type is an n-type, the second conductivity type is a p-type, and vice versa. The photoelectric conversion apparatus 400 can include a semiconductor layer SL. The semiconductor layer SL is, for example, a semiconductor region of the first conductivity type (for example, the n-type), and can be formed by, for example, epitaxial growth. In the semiconductor layer SL, a semiconductor region (only part of it is shown) of the first conductivity type and a semiconductor region (only part of it is shown) of the second conductivity type can be arranged. The semiconductor layer SL has a principal surface 411. The principal surface 411 can be, for example, an interface between the semiconductor layer SL and an insulating film (not shown) stacked on the semiconductor layer SL. Light beams enter the semiconductor layer SL through the principal surface 411. In FIG. 7B, a direction in which light beams mainly enter is represented by arrows L.

The semiconductor layer SL can include a plurality of photoelectric converters (first photoelectric converters) 412a in the light-receiving pixel region 401 and a plurality of photoelectric converters (second photoelectric converters) 412b in the light-shielded pixel region 402. The photoelectric converters 412a and 412b can be semiconductor regions of the first conductivity type, each forming part of a photodiode. Charges generated by photoelectric conversion can be collected by the photoelectric converters 412a and 412b. A semiconductor region 413 of the second conductivity type can be arranged above each of the photoelectric converters 412a and 412b. Each semiconductor region 413 can be arranged to contact the principal surface 411 of the semiconductor layer SL. The semiconductor region 413 may be a region having a charge with the same sign as that of a majority carrier in the second conductivity type.

The semiconductor layer SL can include floating diffusions (to be referred to as FDs hereinafter) 414. Each FD 414 is a semiconductor region of the first conductivity type. Charges generated by each of the photoelectric converters 412a and 412b are transferred to the corresponding FD 414, and converted into a voltage. Each FD 414 can electrically be connected to an input node of an amplifier (not shown). The amplifier can be provided for each pixel or for every plurality of pixels. Gate electrodes 415 can be arranged on a gate insulating film on the semiconductor layer SL. Each gate electrode 415 arranged on a region between each of the photoelectric converters 412a and 412b and each of the FDs 414 is a transfer gate electrode that controls transfer of charges from the photoelectric converter 412 to the FD 414.

A protection film 420 can be arranged to cover the semiconductor layer SL and the gate electrodes 415. An insulating film 421 can be arranged above the semiconductor layer SL or the protection film 420. The insulating film 421 can be made of, for example, silicon oxide. The refractive index of the insulating film 421 falls within, for example, the range of 1.40 to 1.60. A first wiring layer 423, a second wiring layer 424, and a third wiring layer 433 can be arranged above the principal surface 411 of the semiconductor layer SL. The first wiring layer 423, the second wiring layer 424, and the third wiring layer 433 are arranged at different heights with reference to the principal surface 411 of the semiconductor layer SL. In one example, the conductive material of the first wiring layer 423 and the second wiring layer 424 can be copper, and the conductive material of the third wiring layer 433 can be aluminum. In one example, the third wiring layer 433 can form the wiring layer of the peripheral circuit region 403 and a pad. The conductive materials need only be materials having conductivity, and may be materials other than copper and aluminum. The first wiring layer 423 and the second wiring layer 424 can electrically be connected by a plug (not shown). The second wiring layer 424 and the third wiring layer 433 can electrically be connected by a plug (not shown). Except for portions electrically connected by the plug, the conductive member of the first wiring layer 423 and that of the second wiring layer 424 are insulated by the insulating film 421 and the conductive member of the second wiring layer 424 and that of the third wiring layer 433 are insulated by the insulating film 421. The insulating film 421 can function as an interlayer insulating film. The number of wiring layers is not limited to three.

The photoelectric conversion apparatus 400 can include a plurality of waveguides 430 respectively arranged in the light paths of light beams entering the plurality of first photoelectric converters 412a in the light-receiving pixel region 401, and a coupling portion 431 spreading to couple the plurality of waveguides 430. The plurality of waveguides 430 and the coupling portion 431 can be made of the same material. In one example, the plurality of waveguides 430 and the coupling portion 431 can be made of silicon nitride. The refractive indices of the members forming the plurality of waveguides 430 are higher than that of the insulating film 421. The refractive indices of the members forming the plurality of waveguides 430 preferably are equal to or higher than 1.60, and more preferably falls within the range of 1.80 to 2.40. The waveguide 430 can be arranged above each of the plurality of second photoelectric converters 412a in the light-shielded pixel region 402. Similarly, the coupling portion 431 can spread to couple the plurality of waveguides 430 in the light-shielded pixel region 402. The coupling portion 431 in the light-receiving pixel region 401 and that in the light-shielded pixel region 402 can spread to be coupled. In the example shown in FIG. 7B, the coupling portion 431 is not arranged in the peripheral circuit region 403. However, the coupling portion 431 may also be arranged in the peripheral circuit region 403.

An insulating film 432 can be arranged above the insulating film 421, the plurality of waveguides 430, and the coupling portion 431 to spread over the light-receiving pixel region 401 and the light-shielded pixel region 402. From another viewpoint, the insulating film 432 is arranged above the principal surface 411 of the semiconductor layer SL to spread over the light-receiving pixel region 401 and the light-shielded pixel region 402. The insulating film 432 can be made of, for example, silicon oxide. A light-shielding film 434 can be arranged above the insulating film 432 to cover the plurality of second photoelectric converters 412a in the light-shielded pixel region 402. The light-shielding film 434 can be made of, for example, a metal material. The light-shielding film 434 is arranged for the purpose of preventing light beams from entering the plurality of second photoelectric converters 412a in the light-shielded pixel region 402. The lower surface of the light-shielding film 434 is along the principal surface 411 of the semiconductor layer SL to face the plurality of photoelectric converters 412b provided in the light-shielded pixel region 402. In one example, the third wiring layer 433 and the light-shielding film 434 can be arranged in the same layer and made of the same material. However, the third wiring layer 433 and the light-shielding film 434 may be arranged in different layers and made of different materials.

A light transmissive film (insulator) 440 can be arranged above the principal surface 411 of the semiconductor layer SL. The light transmissive film 440 can be arranged to cover the insulating film 432, the light-shielding film 434, and the third wiring layer 433. The light transmissive film 440 can include a plurality of intralayer lenses 441 respectively arranged in the light paths of light beams entering the plurality of first photoelectric converters 412a in the light-receiving pixel region 401. At least one of the upper and lower surfaces of the light transmissive film 440 having the intralayer lenses 441 can have a convex lens shape. In this example, the upper surface of the light transmissive film 440 has a convex lens shape, and the lower surface of the light transmissive film 440 is flat. However, if no intralayer lenses 441 are provided, the upper and lower surfaces of the light transmissive film 440 may be flat. The light transmissive film 440 can be arranged to cover the light-shielding film 434 in the light-shielded pixel region 402. If the intralayer lenses 441 are arranged in the light-shielded pixel region 402, the structure on the light-shielding film 434 becomes high, and thus the intralayer lenses 441 are preferably not arranged in the light-shielded pixel region 402. A planarization insulating film (insulating film 442) can be arranged above at least the intralayer lenses 441 in the light transmissive film 440 to cover the intralayer lenses 441. The insulating film 442 may contact the intralayer lenses 441, and antireflective coating provided to cover the intralayer lenses 441 while contacting the intralayer lenses 441 may be arranged between the intralayer lenses 441 and the insulating film 442.

The light transmissive film 440 is a silicon compound film made of a compound containing silicon and nitrogen. The light transmissive film 440 is a silicon compound film containing nitrogen, and can thus be discriminated from another light transmissive film such as a resin film or a silicon oxide film. The light transmissive film 440 can have a multilayer structure formed from a plurality of silicon compound layers each made of a compound containing silicon and nitrogen. The silicon compound layers that can be included in the light transmissive film 440 are, for example, a silicon nitride layer, a silicon oxynitride layer, and a silicon carbonitride layer.

Each intralayer lens 441 is formed by, for example, a silicon nitride layer, but may be formed by a silicon oxynitride layer having a nitrogen concentration higher than that of another silicon oxynitride layer included in the light transmissive film 440. A layer forming the intralayer lens 441 can be called an intralayer lens layer. If the above-described antireflective coating is formed by a compound containing silicon and nitrogen, such as a silicon oxynitride layer, the antireflective coating can be part of the light transmissive film 440. As the above-described antireflective coating, an antireflection film arranged above the light transmissive film 440 can be used.

An antireflection film or an insulating film on the light transmissive film 440 can be made of a compound containing silicon and oxygen. In one example, each intralayer lens 441 can be made of silicon nitride and the antireflective coating can be made of silicon oxide. In another example, each intralayer lens 441 can be made of silicon oxynitride and the antireflective coating can be made of silicon oxide. In still another example, each intralayer lens 441 can be made of silicon nitride and the antireflective coating can be made of silicon oxynitride. In one example, the insulating film 442 is made of silicon oxide. In another example, the insulating film 442 is made of a resin.

On the semiconductor layer SL in the light-receiving pixel region 401, a light-shielding portion 443 arranged to surround the light path of a light beam entering each of the plurality of first photoelectric converters 412a can be arranged. The light-shielding portion 443 can be made of a metal material, for example, tungsten. The insulating film 442 can be arranged above the light transmissive film (insulator) 440, and the light-shielding portion 443 can be arranged in a groove formed in the insulating film 442. A color filter layer 445 can be arranged above the insulating film 442, and microlenses 450 can be arranged above the color filter layer 445. The light-shielding portion 443 can be arranged in a matrix (for example, a rectangular matrix) so as to prevent light from entering between pixels adjacent to each other in the row direction and the column direction.

In the photoelectric conversion apparatus 400, it is important to suppress the incidence of oblique light beams L', entering the microlens 450 in the light-receiving pixel region 401, on the second photoelectric converters 412b in the light-shielded pixel region 402. This is because if light beams enter the second photoelectric converters 412b in the light-shielded pixel region 402, it is impossible to correctly detect the optical black level. Therefore, the upper end of the light-shielding portion 443 is preferably higher than the upper surface of the light-shielding film 434, and the lower end of the light-shielding portion 443 is preferably lower than the upper surface of the light-shielding film 434. Alternatively, the upper end of the light-shielding portion 443 is preferably higher than the upper surface of the light-shielding film 434, and the lower end of the light-shielding portion 443 is preferably lower than the upper surface of the light-shielding film 434 and higher than the lower surface of the light-shielding film 434.

The light-shielding portion 443 preferably has a structure that is continuous from the lower end of the light-shielding portion 443 to its upper end. In other words, the light-shielding portion 443 preferably has no portion made of a light transmissive material between the lower and upper ends of the light-shielding portion 443. The light-shielding film 434 preferably has a structure that is continuous from the lower surface of the light-shielding film 434 to its upper surface. In other words, the light-shielding film 434 preferably has no portion made of a light transmissive material between the lower and upper surfaces of the light-shielding film 434. The thickness of the light-shielding portion 443 in the direction orthogonal to the principal surface 411 of the semiconductor layer SL is preferably larger than that of the light-shielding film 434 in that direction. In the section (the sectional view of FIG. 2) that is orthogonal to the principal surface 411 of the semiconductor layer SL and partially cuts the plurality of first photoelectric converters 412a, the width of the light-shielding portion 443 in the direction parallel to the principal surface 411 is preferably 0.5 μm or less. This is advantageous in improving the pixel density.

The upper surface of the thinnest portion of the light transmissive film 440 in the light-receiving pixel region 401 is preferably lower than the upper surface of the light-shielding film 434. This is advantageous in suppressing the incidence of light beams on the second photoelectric converters 412b in the light-shielded pixel region 402. The uppermost end (vertex) of each of the plurality of intralayer lenses 441 in the light-receiving pixel region 401 is preferably lower than the upper surface of the light-shielding film 434. This is advantageous in suppressing the incidence of light beams on the second photoelectric converters 412b in the light-shielded pixel region 402 by lowering the height at which the microlenses 450 are arranged. As will be described later, the thinnest portion of the light transmissive film 440 in the light-receiving pixel region 401 may have a flat upper surface and the lower end of the light-shielding portion 443 may be lower than the flat upper surface. This arrangement is also advantageous in suppressing the incidence of light beams on the second photoelectric converters 412b in the light-shielded pixel region 402.

Figure 8:
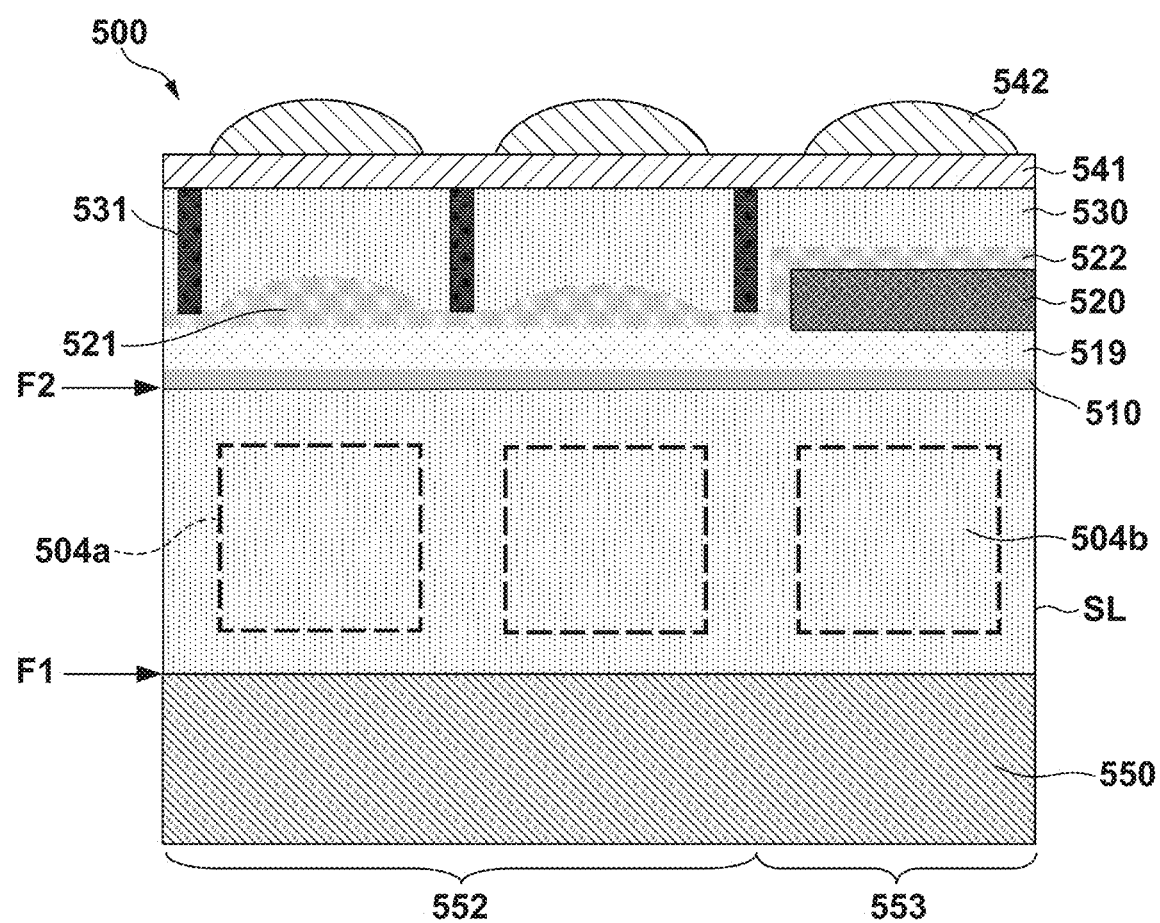
FIG. 8 is a sectional view showing the arrangement of a photoelectric conversion apparatus according to the fifth embodiment.

The arrangement of a photoelectric conversion apparatus 500 according to the fifth embodiment of the present invention will be described below with reference to FIG. 8. Items which are not referred to as the fifth embodiment can comply with the fourth embodiment. The photoelectric conversion apparatus 500 according to the fifth embodiment is formed as a back-side illumination CMOS sensor. Light beams enter a plurality of photoelectric converters 504a through structures (for example, microlenses 542) arranged above a second surface F2 as the principal surface of a semiconductor layer SL.

The photoelectric conversion apparatus 500 includes a light-receiving pixel region 552 and a light-shielded pixel region 553. A wiring structure 550 including gate electrodes and a wiring layer is arranged under a first surface F1 out of the two surfaces of the semiconductor layer SL, that is, the first surface F1 and the second surface F2. An antireflection film 510 can be arranged above the second surface F2 of the semiconductor layer SL. The antireflection film 510 can be made of, for example, aluminum oxide, hafnium oxide, or tantalum oxide. An insulating film 519 can be provided on the antireflection film 510. The insulating film 519 can be made of, for example, silicon oxide. Note that in this specification, "on" and "under" are relative expressions and thus "on" and "under" can be swapped.

A plurality of second photoelectric converters 504b are arranged in the light-shielded pixel region 553. A light-shielding film 520 can be arranged in the light-shielded pixel region 553. The light-shielding film 520 can be made of, for example, a metal material such as aluminum or tungsten. As the distance between the light-shielding film 520 and the second surface F2 of the semiconductor layer SL is smaller, it is possible to suppress the incidence of light beams on the photoelectric converters 504b in the light-shielded pixel region 553, and it is thus desirable that the distance between the light-shielding film 520 and the second surface F2 of the semiconductor layer SL is smaller.

A light transmissive film (insulator) 522 can be arranged above the insulating film 519. The light transmissive film 522 can be arranged to cover the insulating film 519 and the light-shielding film 520. The light transmissive film 522 can include a plurality of intralayer lenses 521 arranged in the light paths of light beams entering the plurality of first photoelectric converters 504a in the light-receiving pixel region 552. The light transmissive film 522 can be arranged to cover the light-shielding film 520 in the light-shielded pixel region 553.

An antireflection film or an insulating film can be arranged above at least the intralayer lenses 521 in the light transmissive film 522 so as to cover the intralayer lenses 521 while contacting the intralayer lenses 521. The light transmissive film 522 can be made of a compound containing silicon and nitrogen, and the antireflection film or the insulating film can be made of a compound containing silicon and oxygen. In one example, the light transmissive film 522 can be made of silicon nitride and the antireflection film or the insulating film can be made of silicon oxide. In another example, the light transmissive film 522 can be made of silicon oxynitride and the antireflection film or the insulating film can be made of silicon oxide.

A light-shielding portion 531 arranged to surround the light path of a light beam entering each of the plurality of first photoelectric converters 504a can be arranged above the semiconductor layer SL in the light-receiving pixel region 552. The light-shielding portion 531 can be made of a metal material, for example, tungsten. An insulating film 530 can be arranged above the light transmissive film (insulator) 522, and the light-shielding portion 531 can be arranged in a groove formed in the insulating film 530. A color filter layer 541 can be arranged above the insulating film 530, and the microlenses 542 can be arranged above the color filter layer 541. The light-shielding portion 531 can be arranged in a matrix (for example, a rectangular matrix) so as to prevent light from entering between pixels adjacent to each other in the row direction and the column direction.

The upper end of the light-shielding portion 531 is preferably higher than the upper surface of the light-shielding film 520, and the lower end of the light-shielding portion 531 is preferably lower than the upper surface of the light-shielding film 520. Alternatively, the upper end of the light-shielding portion 531 is preferably higher than the upper surface of the light-shielding film 520, and the lower end of the light-shielding portion 531 is preferably lower than the upper surface of the light-shielding film 520 and higher than the lower surface of the light-shielding film 520.

The light-shielding portion 531 preferably has a structure that is continuous from the lower end of the light-shielding portion 531 to its upper end. In other words, the light-shielding portion 531 preferably has no portion made of a light transmissive material between the lower and upper ends of the light-shielding portion 531. The light-shielding film 520 preferably has a structure that is continuous from the lower surface of the light-shielding film 520 to its upper surface. In other words, the light-shielding film 520 preferably has no portion made of a light transmissive material between the lower and upper surfaces of the light-shielding film 520. The thickness of the light-shielding portion 531 is preferably larger than that of the light-shielding film 520. In the section (the sectional view of FIG. 8) that is orthogonal to the second surface F2 of the semiconductor layer SL and partially cuts the plurality of first photoelectric converters 504a, the width of the light-shielding portion 531 in the direction parallel to the second surface F2 as the principal surface is preferably 0.5 μm or less. This is advantageous in improving the pixel density.

The upper surface of the thinnest portion of the light transmissive film 522 in the light-receiving pixel region 552 is preferably lower than the upper surface of the light-shielding film 520. This is advantageous in suppressing the incidence of light beams on the second photoelectric converters 504b in the light-shielded pixel region 553. The uppermost end of each of the plurality of intralayer lenses 521 in the light-receiving pixel region 552 is preferably lower than the upper surface of the light-shielding film 520. This is advantageous in suppressing the incidence of light beams on the second photoelectric converters 504b in the light-shielded pixel region 553 by lowering the height at which the microlenses 542 are arranged. The thinnest portion of the light transmissive film 522 in the light-receiving pixel region 552 may have a flat upper surface and the lower end of the light-shielding portion 531 may be lower than the flat upper surface. This arrangement is also advantageous in suppressing the incidence of the light beams on the second photoelectric converters 504b in the light-shielded pixel region 553.

Figure 7:
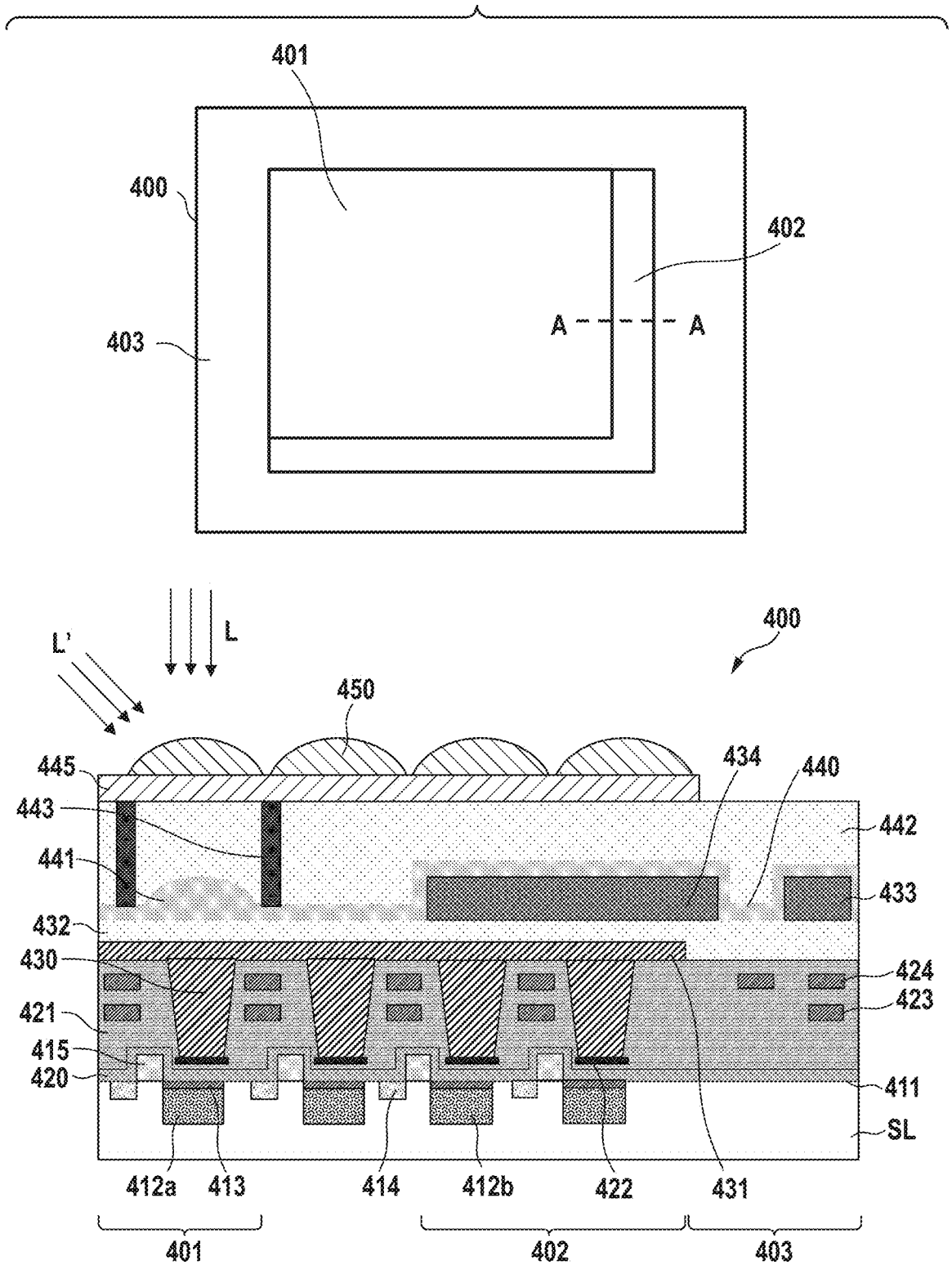
FIG. 7 depicts a plan view and a sectional view each showing the arrangement of a photoelectric conversion apparatus according to the fourth embodiment.

The fourth embodiment is compatible with the third embodiment. That is, the light-shielding portion 443 in the fourth embodiment corresponds to the portion 601 of the light-shielding wall 60 in the third embodiment, and the light-shielding film 434 in the fourth embodiment corresponds to the light-shielding portion 501 of the light-shielding film 50 in the third embodiment. In addition, the fifth embodiment is compatible with the first or second embodiment. That is, the light-shielding portion 531 in the fifth embodiment corresponds to the portion 601 of the light-shielding wall 60 in the first or second embodiment, and the light-shielding film 520 in the fifth embodiment corresponds to the light-shielding portion 501 of the light-shielding film 50 in the first or second embodiment. When the light-shielding portion 443 or 531 is made of tungsten, it is possible to improve the light-shielding performance of the light-shielding film 434 or 520 by making the light-shielding film 434 or 520 by aluminum. When, as shown in FIG. 7, the thickness of the light-shielding film 434 in the direction perpendicular to the principal surface 411 is larger than that of the light-shielding portion 443 in the direction parallel to the principal surface 411, it is possible to improve the light-shielding performance of the light-shielding film 434. When, as shown in FIG. 8, the thickness of the light-shielding film 520 in the direction perpendicular to the principal surface F2 is larger than that of the light-shielding portion 531 in the direction parallel to the principal surface F2, it is possible to improve the light-shielding performance of the light-shielding film 520. If the thickness of the light-shielding film 520 is larger than that of the light-shielding portion 531, when the light-shielding portion 443 or 531 is made of tungsten, the light-shielding film 434 or 520 may be made of aluminum or tungsten but is preferably made of aluminum.

The sixth to 11th embodiments of the present invention will be described below with reference to the accompanying drawings. Throughout the drawings, reference numerals may be omitted with respect to components having the same functions. The present invention is not limited to the embodiments to be described below. For example, some components of one of the following embodiments may be added to another embodiment or replaced by some components of another embodiment. Note that although an example in which the present invention is applied to a stacked photoelectric conversion apparatus will be described below as an embodiment of the present invention, the present invention is not limited to the stacked photoelectric conversion apparatus. Furthermore, although the present invention applied to a back-side illumination photoelectric conversion apparatus will be explained below as an embodiment of the present invention, the present invention is also applicable to a front-side illumination photoelectric conversion apparatus. Although a case in which signal charges are electrons will be described below as an embodiment of the present invention, the present invention is also applicable to case in which signal charges are holes. The conductivity type of each component is changeable appropriately.

There is known a solid-state image capturing apparatus in which an insulating layer having a negative fixed charge is provided on a silicon layer in which a photodiode is formed. Japanese Patent Laid-Open No. 2011-35204 discloses a technique of blocking a substance (hydrogen or the like) that lowers a negative bias effect not to enter by forming a dense film on the insulating layer having the negative fixed charge using atomic layer deposition or organic metal chemical vapor deposition. In the technique described in Japanese Patent Laid-Open No. 2011-35204, it is necessary to form a thick dense film on the insulating layer for covering photoelectric conversion elements, and thus light entering the photoelectric conversion elements can be absorbed. To cope with this, each of the sixth to 11th embodiments provides a technique in which it is possible to suppress a decrease in sensitivity while reducing noise.

Figure 9A:
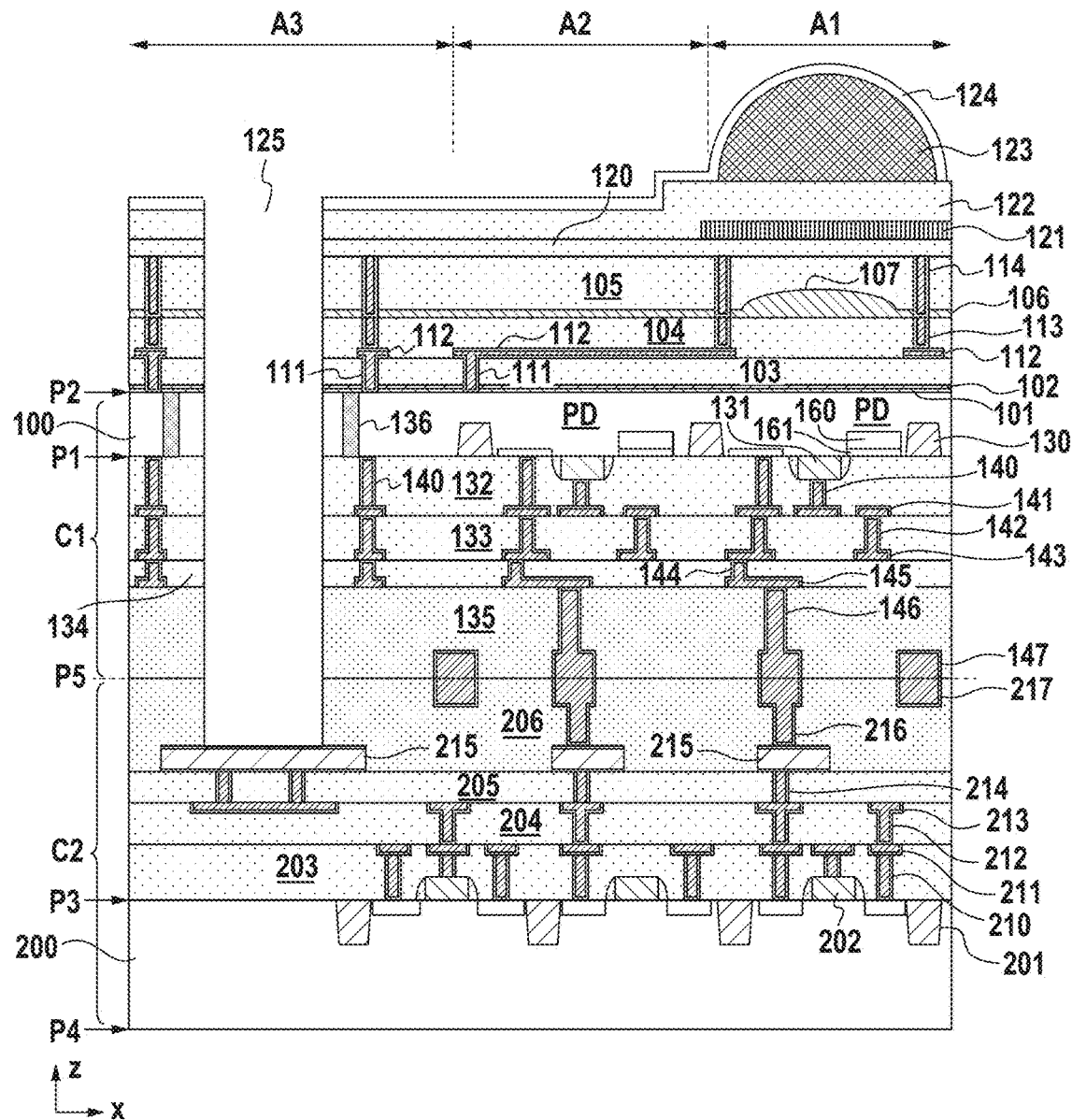
FIGS. 9A and 9B are respectively a schematic sectional view showing a photoelectric conversion apparatus for explaining the sixth embodiment and an enlarged schematic sectional view showing part of the photoelectric conversion apparatus for explaining the sixth embodiment.

FIG. 9A is a schematic sectional view showing a photoelectric conversion apparatus according to the sixth embodiment. The photoelectric conversion apparatus shown in FIG. 9A has a sectional structure in a plane including the Z and X directions. A description will be provided by setting the Z direction as the upper direction. Referring to FIG. 9A, the photoelectric conversion apparatus includes an effective region A1, an OB region A2, and a pad region A3. The effective region A1 is a region where a unit cell for detecting light and generating a signal is arranged. The OB region A2 is an optical black region, and is a region where a light-shielded unit cell for generating a reference signal is arranged. The pad region A3 is a region where an external terminal for connection to an external apparatus is connected. The unit cell includes at least one photoelectric conversion element, and is also called a pixel.

The photoelectric conversion apparatus is a stacked photoelectric conversion apparatus formed by including at least two chips C1 and C2. The chip C1 includes at least photoelectric conversion elements PD. The chip C2 includes a driving circuit for reading out signals from the photoelectric conversion elements PD and a processing circuit for processing the signals. The chips C1 and C2 are joined at a surface P5.

The chip C1 shown in FIG. 9A will be described first. The photoelectric conversion apparatus includes a semiconductor layer 100 with the photoelectric conversion elements PD. The semiconductor layer 100 includes a surface P1 and a surface P2 on the opposite side of the surface P1. The surface P1 or P2 is the principal surface of the semiconductor layer 100. A planar layout or planar view (to be described later) is assumed to be a projection view on the surface P1.

Each photoelectric conversion element PD includes an n-type semiconductor region 160 and a p-type semiconductor region 161 arranged between the semiconductor region 160 and the surface P1. Each photoelectric conversion element PD can include the semiconductor layer 100. The photoelectric conversion element PD in the effective region A1 generates charges corresponding to light, and the charges generated by the photoelectric conversion element PD in the effective region A1 are used as an image or light detection signal. The photoelectric conversion element PD in the OB region A2 is shielded, and charges generated by the photoelectric conversion element PD in the OB region A2 are used to generate a reference signal. The semiconductor layer 100 is made of a semiconductor material, for example, a single crystal silicon substrate or silicon obtained by epitaxial growth.

Films 101 to 105 are sequentially arranged above the surface P2 of the semiconductor layer 100 in the upper direction in this order. A film 106 including a lens portion 107 is arranged between the films 104 and 105. The films 101 and 102 are arranged between the semiconductor layer 100 and the film 106, and arranged in at least a portion where the photoelectric conversion elements PD are arranged. The film 101 has a negative charge and can function as a negative fixed charge film. That is, the film 101 has a charge of the same conductivity type as that of a charge generated in the photoelectric conversion element. The film 101 is a metal oxide film such as a hafnium oxide film, an aluminum oxide film, a zirconium oxide film, a niobium oxide film, a titanium oxide film, or a vanadium oxide film. The film 102 is a metal oxide film such as a tantalum oxide film or a titanium oxide film, and can function as an antireflection film. Each of the films 103 to 105 is an insulating film such as a silicon oxide film, a silicon nitride film, a silicon oxynitride film, a carbon containing silicon oxide film, or a fluorine containing silicon oxide film, and can function as an interlayer insulating film. The film 106 is an insulating film made of silicon nitride or the like, and can function as a protection film or a lens. The lens portion 107 is integrated with the film 106, and is superimposed on at least one photoelectric conversion element PD in a planar view. That is, the lens portion 107 condenses light to at least one of the photoelectric conversion elements PD. In the sixth embodiment, the film 101 is an aluminum oxide film, the film 102 is a titanium oxide film, the films 103 to 105 are silicon oxide films, and the film 106 is a silicon nitride film. These films may have a single layer arrangement made of one material or a multilayer arrangement made of a plurality of materials.

A contact plug 111, a wiring layer 112, and via plugs 113 and 114 are arranged between the films 103 to 105. The contact plug 111 is arranged in the OB region A2 and electrically connected to the semiconductor layer 100. The wiring layer 112 is arranged in the effective region A1, and has apertures at positions respectively corresponding to the photoelectric conversion elements PD, thereby defining the apertures of the photoelectric conversion elements PD. The wiring layer 112 is arranged in the OB region A2, and can function as a light-shielding portion that covers the position corresponding to the photoelectric conversion element PD. The via plug 113 is arranged in the effective region A1, and arranged in an opening (a trench or a hole) of the film 104. The via plug 113 is arranged between the films 106 and 101. The via plug 113 also functions as a light-shielding portion that defines the aperture for the photoelectric conversion element PD. The via plug 114 is arranged in the effective region A1, is arranged at least in an opening (a trench or a hole) of the film 105, contacts the via plug 113, and functions as a light-shielding portion that defines the aperture for the photoelectric conversion element PD. Each of the contact plug 111, the wiring layer 112, and the via plugs 113 and 114 includes a plurality of metal portions. In the following description, the wiring layer includes a plurality of wirings, that is, a dielectric pattern. The arrangement of these metal portions will be described in detail with reference to FIG. 9B.

Figure 9B:
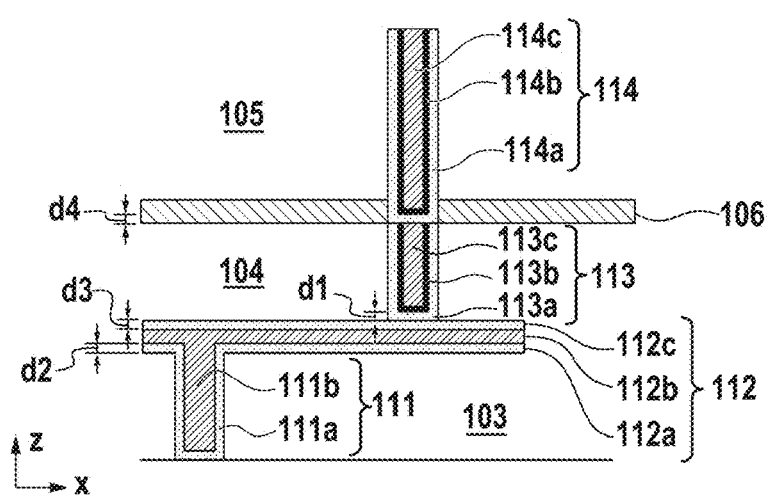

FIG. 9B is an enlarged view partially showing the contact plug 111, the wiring layer 112, the via plugs 113 and 114, and the films 103 to 106, all of which are shown in FIG. 9A. The contact plug 111 is formed integrally with the wiring layer 112. The contact plug 111 includes portions 111(a) and 111(b). The wiring layer 112 includes portions 112(a), 112(b), and 112(c). The via plug 113 includes portions 113(a), 113(b), and 113(c). The via plug 114 includes portions 114(a), 114(b), and 114(c). The portions 111(a), 112(a), 112(c), 113(a), and 114(a) are metal portions made of a metal having a hydrogen storage effect. Examples of the metal having the hydrogen storage effect are titanium, zirconia, palladium, and magnesium. In the sixth embodiment, assume that these portions are made of titanium. The portions 111(b), 112(b), 113(c), and 114(c) are metal portions made of tungsten or aluminum different from the metal having the hydrogen storage effect. In the sixth embodiment, assume that these portions are made of tungsten. The portions 113(b) and 114(b) are made of a material different from the metal having the hydrogen storage effect, and are portions made of, for example, titanium nitride. In the sixth embodiment, a thickness d1 of the portion 113(a) as a titanium film, a thickness d2 of the portion 112(a), a thickness d3 of the portion 112(c), and a thickness d4 of the portion 114(a) are equal to each other. The thicknesses d1, d2, d3, and d4 fall within, for example, the range of 5 nm (inclusive) to 20 nm (inclusive), and are 10 nm in the sixth embodiment. The thicknesses of the portions 113(b) and 114(b) fall within the range of 40 nm (inclusive) to 60 nm (inclusive), and is 50 nm in the sixth embodiment.

When the portion 113(a) made of titanium is included as in the sixth embodiment, hydrogen entering from the outside and hydrogen contained in the films 103 to 106 can be stored, and it is thus possible to reduce supply of hydrogen to the film 101. Especially when the film 106 or the like is a film made of silicon nitride, this film may have a hydrogen content larger than that of a film made of silicon oxide depending on a formation method. When a film made of silicon nitride is included as a protection film or lens as in the sixth embodiment, this arrangement is effective. With this arrangement, a decrease in negative bias effect of the film 101 is suppressed, thereby making it possible to reduce noise. In addition, since the portion 113(a) forms an aperture for the photoelectric conversion element PD, it is possible to suppress a decrease in sensitivity of the photoelectric conversion element PD.

Similarly, when the portion 114(a) made of titanium is included, the hydrogen storage amount increases, and it is thus possible to suppress an increase in noise. Furthermore, since the portion 114(a) forms an aperture for the photoelectric conversion element PD, it is possible to suppress a decrease in sensitivity of the photoelectric conversion element PD.

Similarly, since the contact plug 111 and the wiring layer 112 respectively include the portion 111(a) and the portions 112(a) and 112(c), all of which are made of titanium, it is possible to suppress an increase in noise. Since the wiring layer 112 arranged in the effective region A1 includes an aperture for the first photoelectric conversion element, a decrease in sensitivity of the photoelectric conversion element can be suppressed. Since the wiring layer 112 arranged in the OB region A2 includes the portions 112(a) and 112(c) made of titanium, a decrease in negative bias effect of the film 101 can also be suppressed in the OB region A2.

In the planar view, the via plug 113 has a shape that surrounds at least one photoelectric conversion element PD. For example, the via plug 113 is in a matrix in the planar view. For example, in an arrangement in which one microlens is included in correspondence with the plurality of photoelectric conversion elements PD to obtain distance information and phase difference information, the via plug 113 may be provided to surround one region where the plurality of photoelectric conversion elements PD are arranged. Similarly, in the planar view, the wiring layer 112 arranged in the effective region A1 has a shape that surrounds at least one photoelectric conversion element PD or may be provided to surround one region where the plurality of photoelectric conversion elements PD are arranged. Furthermore, in the planar view, the via plug 114 may have a shape that surrounds at least one photoelectric conversion element PD or may be provided to surround one region where the plurality of photoelectric conversion elements PD are arranged.

A structure above the film 105 in FIG. 9A will be described. A film 120 is arranged above the film 105. The film 120 is made of an inorganic material such as a silicon nitride film, a silicon oxide film, or a silicon oxynitride film or an organic material such as an acrylic resin or a polyimide resin. The film 120 can function as a planarizing film or protection film. A color filter 121 is arranged above the film 120 above the photoelectric conversion element PD. The color filter 121 can transmit light of an arbitrary wavelength. A film 122 is arranged above the film 120 and the color filter 121, is made of an organic material such as an acrylic resin or a polyimide resin, and can function as a planarizing film. A microlens 123 is made of an organic material such as an acrylic resin or a polyimide resin, and is arranged above the film 122 above the photoelectric conversion element PD. The microlens 123 condenses light to at least one photoelectric conversion element PD. In the planar view, the microlens 123 is superimposed on at least one photoelectric conversion element PD. The film 122 and the microlens 123 may be formed from one film. A film 124 is arranged above the microlens 123 and the film 122, is made of an inorganic material such as a silicon oxide film or an organic material containing fluorine, and can function as a protection film or an antireflection film. The color filter 121 and the microlens 123 are also provided for another unit cell in the effective region A1. The microlens 123 and the color filter 121 may be arranged in the OB region A2 to improve the flatness and prevent stray light.

On the side of the surface P1 of the semiconductor layer 100 in FIG. 9A, gate electrodes 131 for forming elements such as transistors, semiconductor regions, element separation portions 130, and the like are arranged. The gate electrodes 131 shown in the effective region A1 and the OB region A2 in FIG. 9A are, for example, gate electrodes forming transfer transistors. On the side of the surface P1, films 132, 133, 134, and 135 are arranged in a lower direction opposite to the Z direction in this order. In the films 132 to 135, a contact plug 140, a wiring layer 141, a via plug 142, a wiring layer 143, a via plug 144, a wiring layer 145, a via plug 146, and a wiring layer 147 are arranged in the lower direction opposite to the Z direction in this order. The wiring layer 147 can serve as an electrode that is connected to the chip C2. With this wiring structure, signals based on charges generated in the photoelectric conversion elements PD of the semiconductor layer 100 are transmitted to the chip C2. Note that the films 132 to 135 are insulating films made of a material appropriately selected from the materials described above with respect to the films 103 to 105, and may be single layer films or multilayer films. The contact plug 140 includes, for example, a portion made of titanium, a portion made of titanium nitride, and a portion made of tungsten. The wiring layer 141 includes, for example, a portion made of tantalum and a portion mainly containing copper. Each of the set of the via plug 142 and wiring layer 143, the set of the via plug 144 and wiring layer 145, and the set of the via plug 146 and wiring layer 147 includes a portion made of tantalum and a portion mainly containing copper, and has an integrally formed dual damascene structure.

The chip C2 shown in FIG. 9A will be described next. The chip C2 includes a semiconductor layer 200. The semiconductor layer 200 includes a surface P3 and a surface P4 on the opposite side of the surface P3. The semiconductor layer 200 is provided with element separation portions 201 and semiconductor regions that form elements such as transistors and capacitances are formed. A plurality of wiring layers are arranged between the semiconductor layers 100 and 200.

Gate electrodes 202 forming transistors, and films 203, 204, 205, and 206 are arranged above the surface P3 in the Z direction in this order. Furthermore, in the films 203 to 206, a contact plug 210, a wiring layer 211, a via plug 212, a wiring layer 213, a via plug 214, a wiring layer 215, a via plug 216, and a wiring layer 217 are arranged in the Z direction in this order. The wiring layer 217 can serve as an electrode that is connected to the chip C1. With this wiring structure, it is possible to receive signals based on charges generated in the photoelectric conversion elements PD of the semiconductor layer 100, process the signals, and output the processed signals as data outside the photoelectric conversion apparatus. The films 203 to 206 are insulating films made of a material appropriately selected from the materials described above with respect to the films 103 to 105, and may be single layer films or multilayer films. The contact plug 210 includes, for example, a portion made of titanium, a portion made of titanium nitride, and a portion made of tungsten. The wiring layer 211 includes, for example, a portion made of tantalum and a portion mainly containing copper. Each of the set of the via plug 212 and wiring layer 213 and the set of the via plug 216 and wiring layer 217 includes a portion made of tantalum and a portion mainly containing copper, and has an integrally formed dual damascene structure. The via plug 214 includes, for example, a portion made of titanium nitride and a portion made of tungsten. The wiring layer 215 includes, for example, a metal portion mainly containing aluminum. The wiring layer 215 can serve as a pad that is connected to an external terminal in the pad region A3. Similar to the via plug 113 or 114, the via plug 214 includes a portion made of tungsten. However, the via plug 214 that connects the wiring layers 213 and 215 is not provided with a portion made of titanium. In the sixth embodiment, a portion made of titanium is provided in a portion located above the fixed charge film. More specifically, a portion made of titanium is provided in at least part of the contact plug 111, wiring layer 112, and via plugs 113 and 114. This arrangement can suppress a decrease in performance of the fixed charge film.

In the pad region A3 shown in FIG. 9A, an opening 125 that exposes one wiring layer 215 serving as a pad portion is formed. The opening 125 is formed over the films 124, 122, 120, 101 to 106, the semiconductor layer 100, the films 132 to 135 and 206. That is, the opening 125 penetrates the chip C1. In the pad region A3, the contact plug 111, the wiring layer 112, and the via plugs 113 and 114 are arranged along the side surface of the opening 125, that is, in the Z direction, and are arranged to contact each other. These elements can function as a guard ring that reduces mixture of a metal or water in the films 101 to 105 from the opening 125. A separation region 136 is arranged along the side surface of the opening 125 in the semiconductor layer 100. The separation region 136 has, for example, an arrangement in which an insulator made of silicon oxide or the like is arranged in a groove penetrating the semiconductor layer 100. The separation region 136 can function as a guard ring that reduces mixture of a metal or water in the semiconductor layer 100 in the effective region A1 or the OB region A2 from the opening 125. In the pad region A3, the contact plug 140, the wiring layer 141, the via plug 142, the wiring layer 143, the via plug 144, and the wiring layer 145 are arranged along the side surface of the opening 125, that is, in the Z direction, and are arranged to contact each other. These elements can function as a guard ring that reduces mixture of a metal or water in the films 132 to 134 from the opening 125.

With the structure of the photoelectric conversion apparatus shown in FIG. 9A, the metal portions store hydrogen, it is possible to reduce the supply amount of hydrogen to the film 101 functioning as a fixed charge film, thereby suppressing a decrease in characteristic as a fixed charge film. Therefore, it is possible to suppress an increase in noise of the photoelectric conversion apparatus. In addition, when the metal portion capable of storing hydrogen forms an aperture corresponding to the photoelectric conversion element, absorption of light by the metal portion is reduced. Therefore, it is possible to provide the photoelectric conversion apparatus having a satisfactory noise characteristic while suppressing a decrease in sensitivity of the photoelectric conversion element.

Note that the wiring layer 112 arranged in the OB region A2 can function as a light-shielding film that reduces the incidence of light on the photoelectric conversion element in the OB region A2. The metal portion of the wiring layer 112, that can store hydrogen, may be partially removed. This is because the wiring layer 112 can reduce hydrogen reaching the film 101 from the films 104 to 106.

A method of manufacturing the photoelectric conversion apparatus according to the sixth embodiment will be described next with reference to FIGS. 10A to 14B. For the sake of descriptive convenience, the same reference numerals may denote members before and after processing.

Figure 10A:
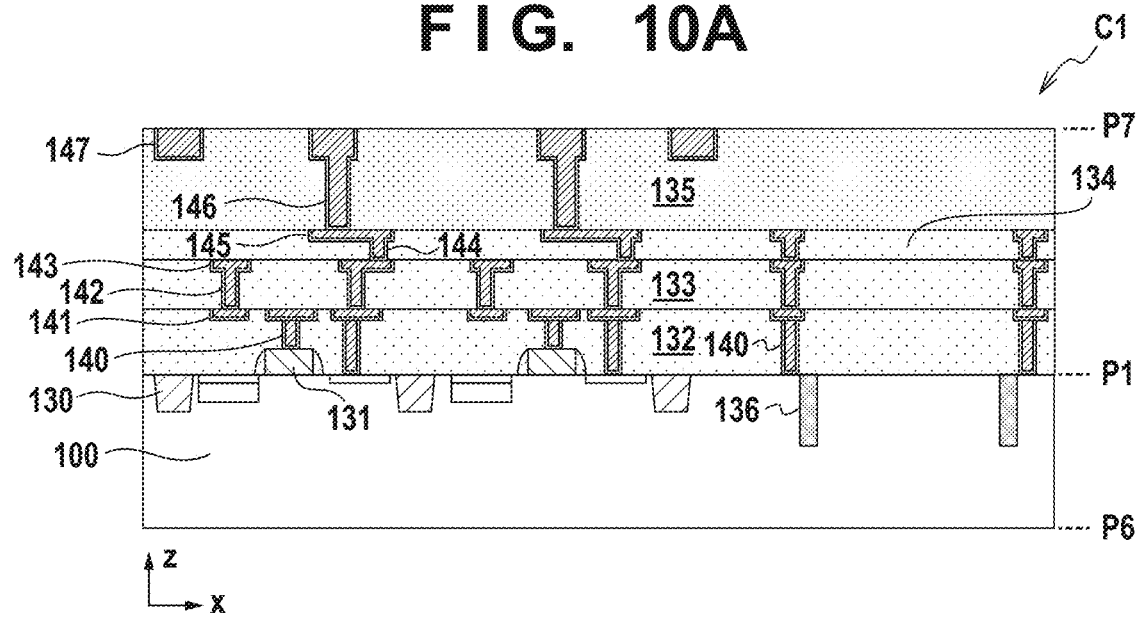
FIGS. 10A and 10B are respectively a schematic sectional view for explaining a method of manufacturing a photoelectric conversion apparatus according to the sixth embodiment and a schematic sectional view for explaining a method of manufacturing a photoelectric conversion apparatus according to the seventh embodiment.

In FIG. 10A, the chip C1 is prepared. The element separation portions 130, the semiconductor regions 160 and 161, semiconductor regions serving as the source/drain of a transistor, and the like are formed in the semiconductor layer 100 including the surfaces P1 and P6. At this time, the separation regions 136 are formed by forming grooves by etching the semiconductor layer 100, burying an insulating film, and removing an unnecessary insulating film. The depth of the separation region 136 is about 2 to 5 μm. In the planar view, the separation region 136 is arranged to surround a pad portion to be formed later. The gate electrodes 131 are formed on the surface P1 of the semiconductor layer 100, thereby forming a wiring structure. The wiring structure includes the films 132 to 135, the contact plug 140, the wiring layer 141, the via plug 142, the wiring layer 143, the via plug 144, the wiring layer 145, the via plug 146, and the wiring layer 147. Various elements, films, wiring structures, and the like can be formed by a general semiconductor manufacturing method. Finally, the chip C1 includes surfaces P6 and P7.

Figure 10B:
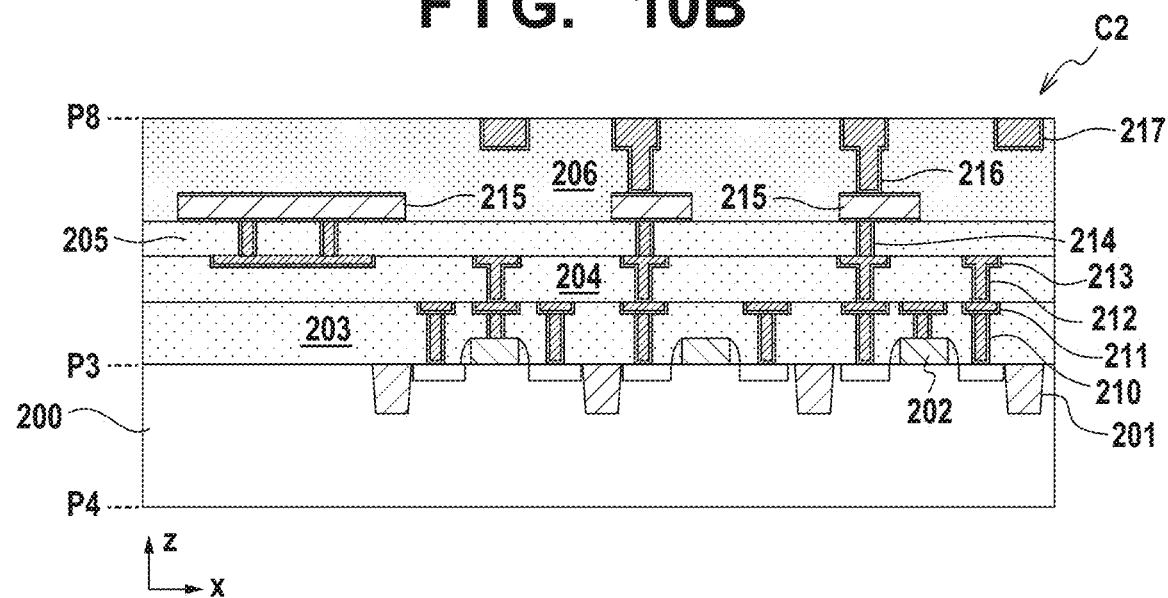

As shown in FIG. 10B, the chip C2 is prepared. The element separation portions 201, semiconductor regions serving as the source/drain of a transistor, and the like are formed in the semiconductor layer 200 including the surfaces P3 and P4. The gate electrodes 202 are formed on the surface P3 of the semiconductor layer 200, thereby forming a wiring structure. The wiring structure includes the films 203 to 206, the contact plug 210, the wiring layer 211, the via plug 212, the wiring layer 213, the via plug 214, the wiring layer 215, the via plug 216, and the wiring layer 217. Various elements, films, wiring structures, and the like can be formed by the general semiconductor manufacturing method. Finally, the chip C2 includes a surface P8 and the surface P4.

Figure 11A:
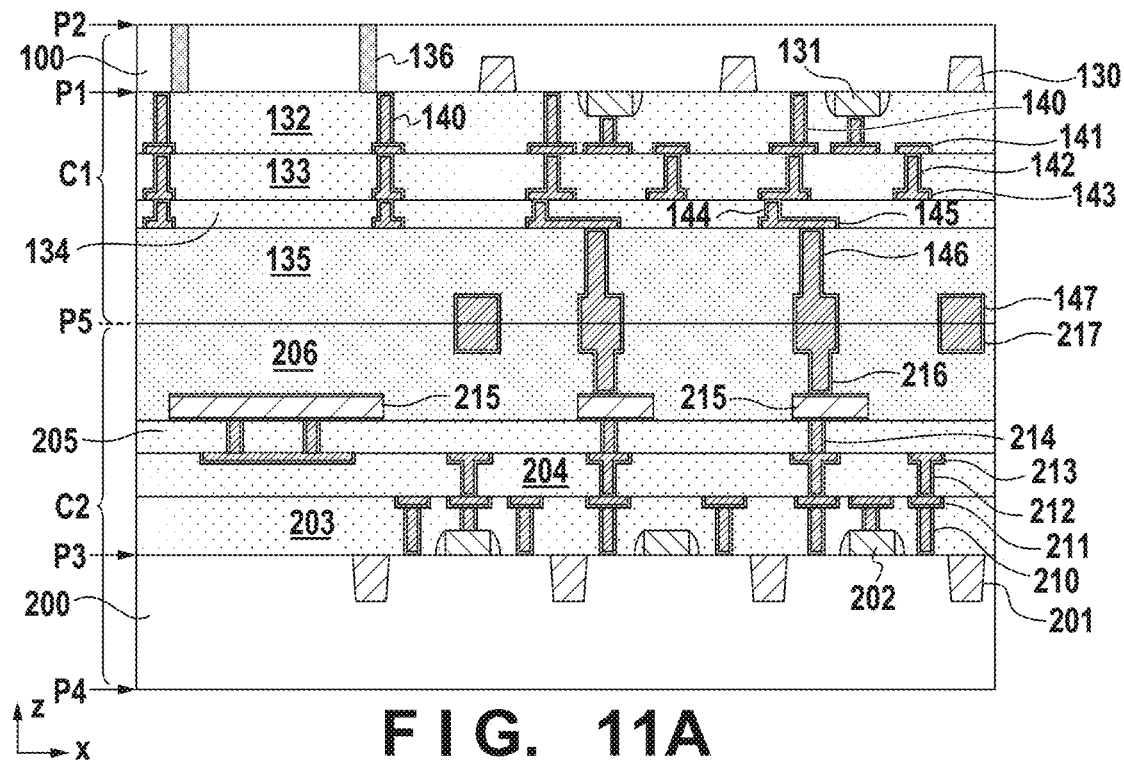
FIGS. 11A and 11B are schematic sectional views each for explaining the method of manufacturing the photoelectric conversion apparatus according to the sixth embodiment.

Referring to FIG. 11A, the chips C1 and C2 are joined, and the semiconductor layer 100 of the chip C1 is thinned. The surface P7 of the chip C1 and the surface P8 of the chip C2 are joined to integrate the wiring layers 147 and 217. The surface P5 is a joint surface. After that, the semiconductor layer 100 of the chip C1 is thinned from the surface P6 by mechanical polishing, chemical mechanical polishing, or the like. The semiconductor layer 100 is thinned to the surface P2. The separation region 136 is exposed at the surface P2.

Figure 11B:
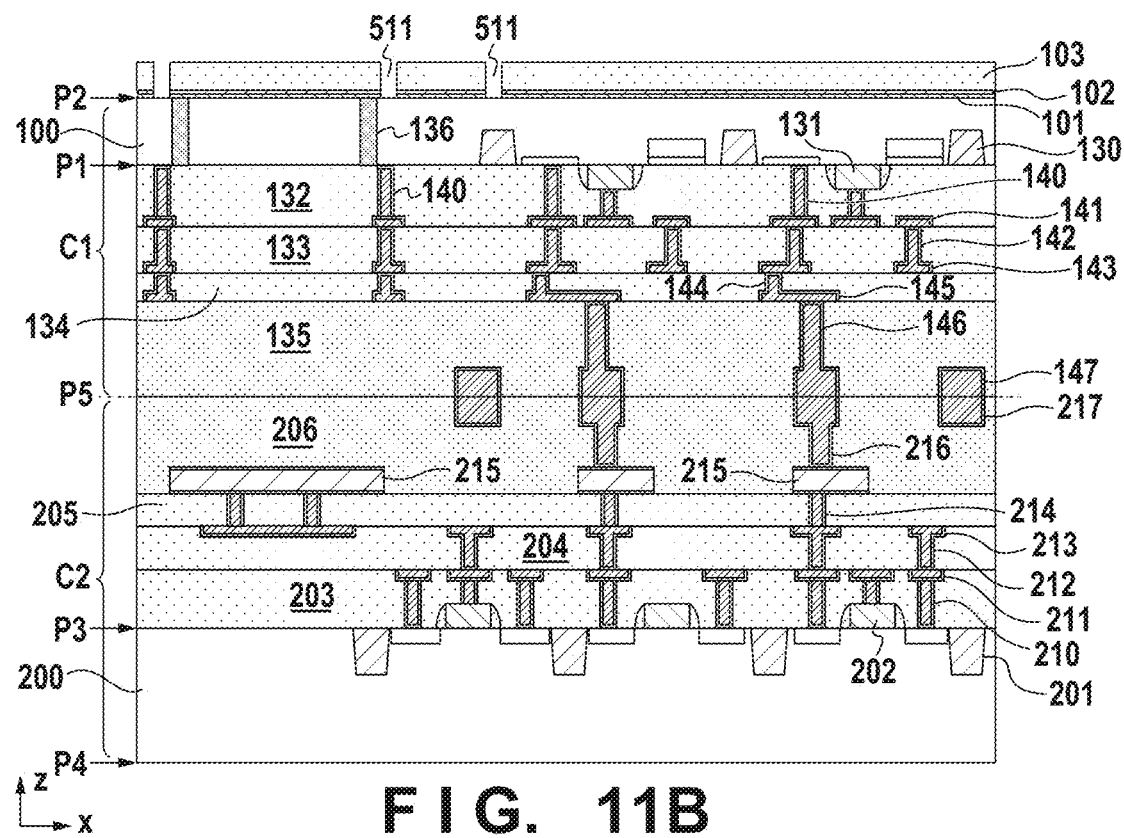

Referring to FIG. 11B, the films 101, 102, and 103 are formed on the surface P2 in this order, and openings (trenches or holes) 511 penetrating the films 101 to 103 are formed. The film 101 is a film made of the above-described material, and can be formed by, for example, ALD (Atomic Layer Deposition). The film 102 is a film made of the above-described material, and can be formed by, for example, ALD, PVD (Physical Vapor Deposition), or CVD (Chemical Vapor Deposition). The film 103 can be formed by PVD or CVD. After that, the openings 511 are formed in the films 101 to 103. The openings 511 can be formed by etching.

Figure 12A:
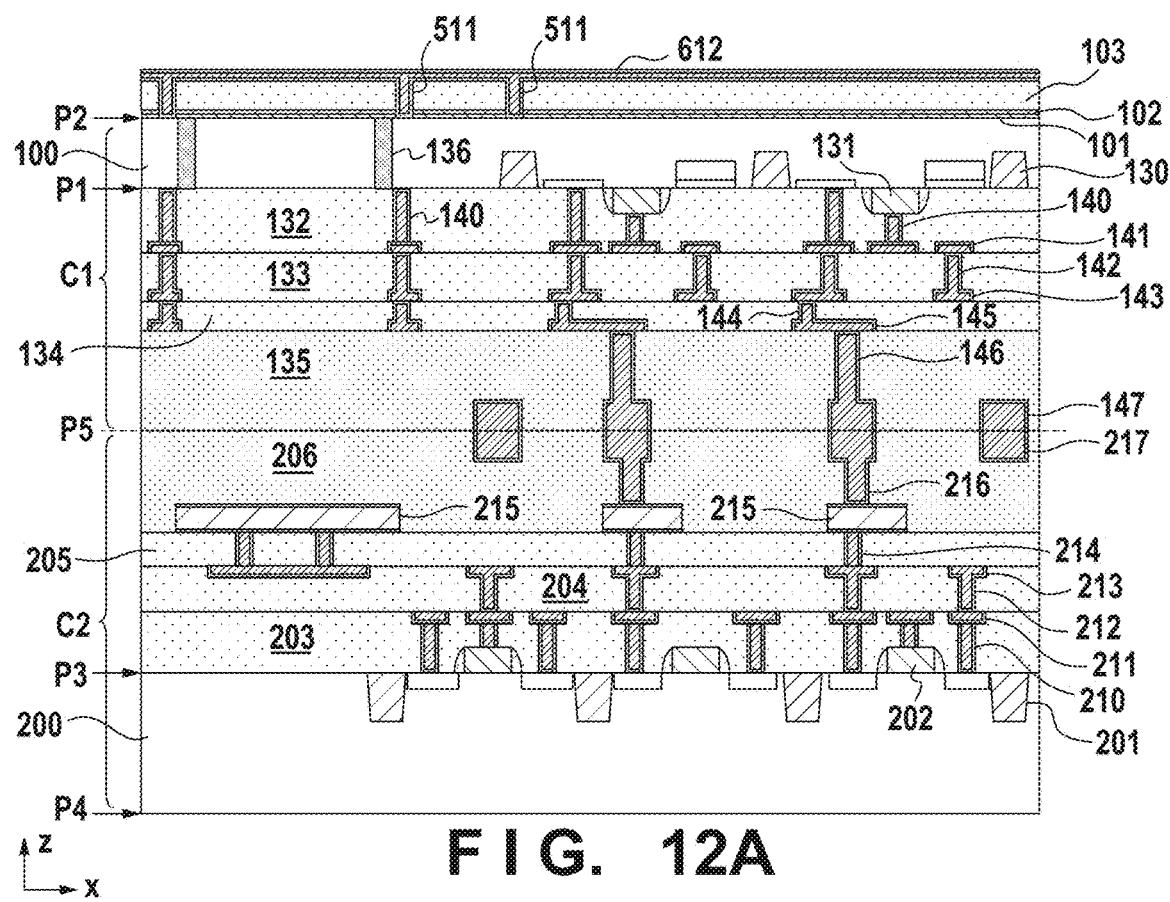
FIGS. 12A and 12B are respectively a schematic sectional view for explaining the method of manufacturing the photoelectric conversion apparatus according to the sixth embodiment and a schematic sectional view for explaining a method of manufacturing a photoelectric conversion apparatus according to the eighth embodiment.
Figure 12B:
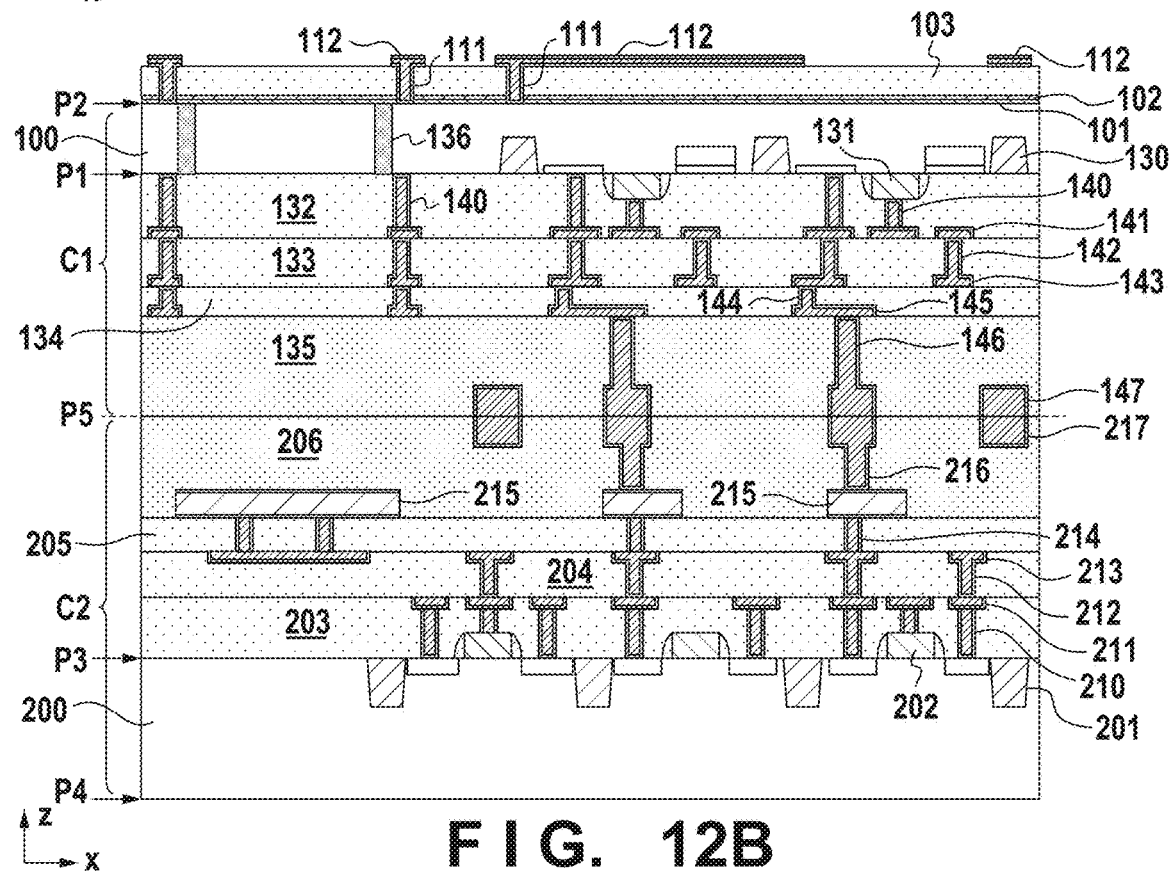

Referring to FIG. 12A, the openings 511 are filled to form a metal film 612 over the film 103. The metal film 612 is a stacked film, and is formed as follows. A titanium film is formed along the upper surface of the film 103 and the bottom and side surfaces of the openings 511, a tungsten film is formed on the titanium film, and then, a titanium film is formed again on the tungsten film. Next, the metal film 612 is patterned by etching, thereby forming the contact plug 111 and the wiring layer 112 shown in FIG. 12B.

Figure 13A:
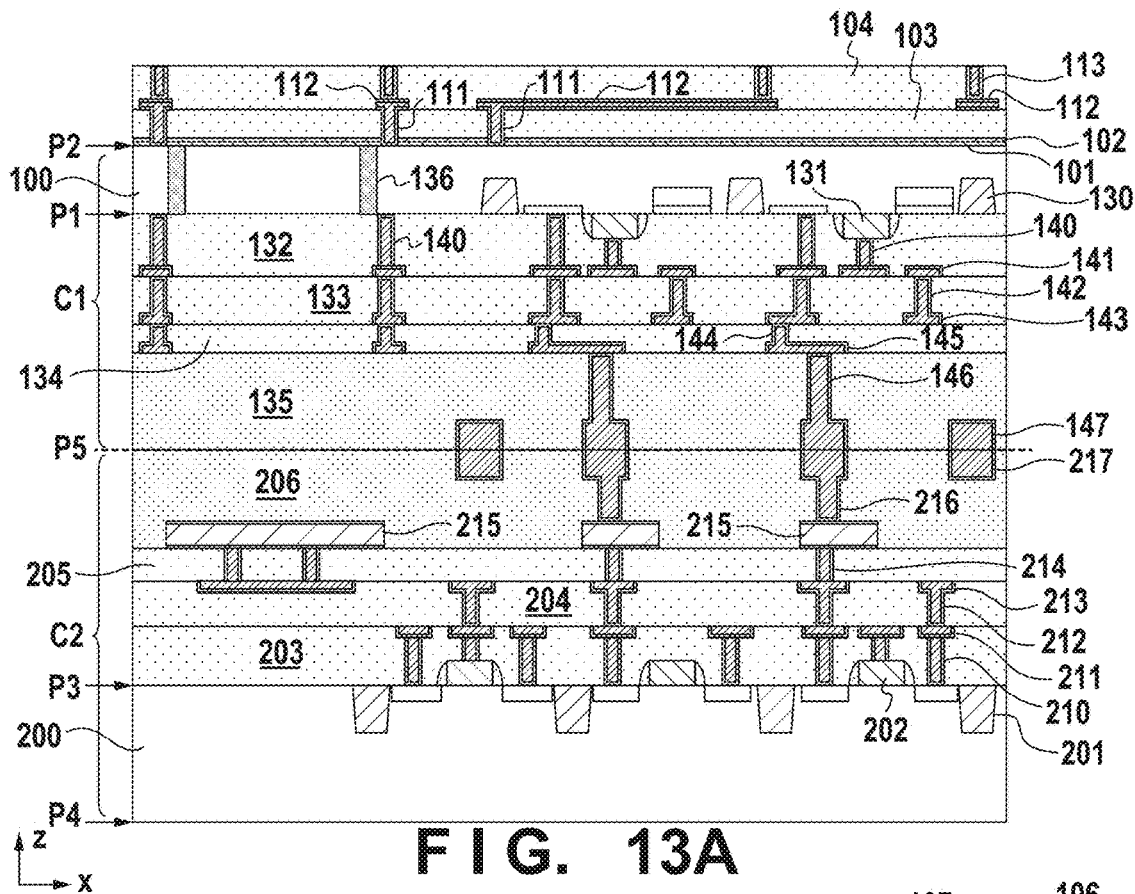
FIGS. 13A and 13B are respectively a schematic sectional view for explaining the method of manufacturing the photoelectric conversion apparatus according to the sixth embodiment and a schematic sectional view for explaining the method of manufacturing the photoelectric conversion apparatus according to the eighth embodiment.

Referring to FIG. 13A, the film 104 is formed on the wiring layer 112, and the via plug 113 is formed in the film 104. The film 104 can be formed by PVD or CVD. The via plug 113 is formed as follows. Openings are formed in the film 104, the openings of the film 104 are filled, and a metal film is formed to cover the upper surface of the film 104. The metal film formed on the upper surface of the film 104 is removed by etching or CMP, thereby forming the via plug 113 having the upper surface flush with the upper surface of the film 104. The metal film for forming the via plug 113 is a multilayer film of a titanium film, a titanium nitride film formed on the titanium film, and a tungsten film formed on the titanium nitride film.

Figure 13B:
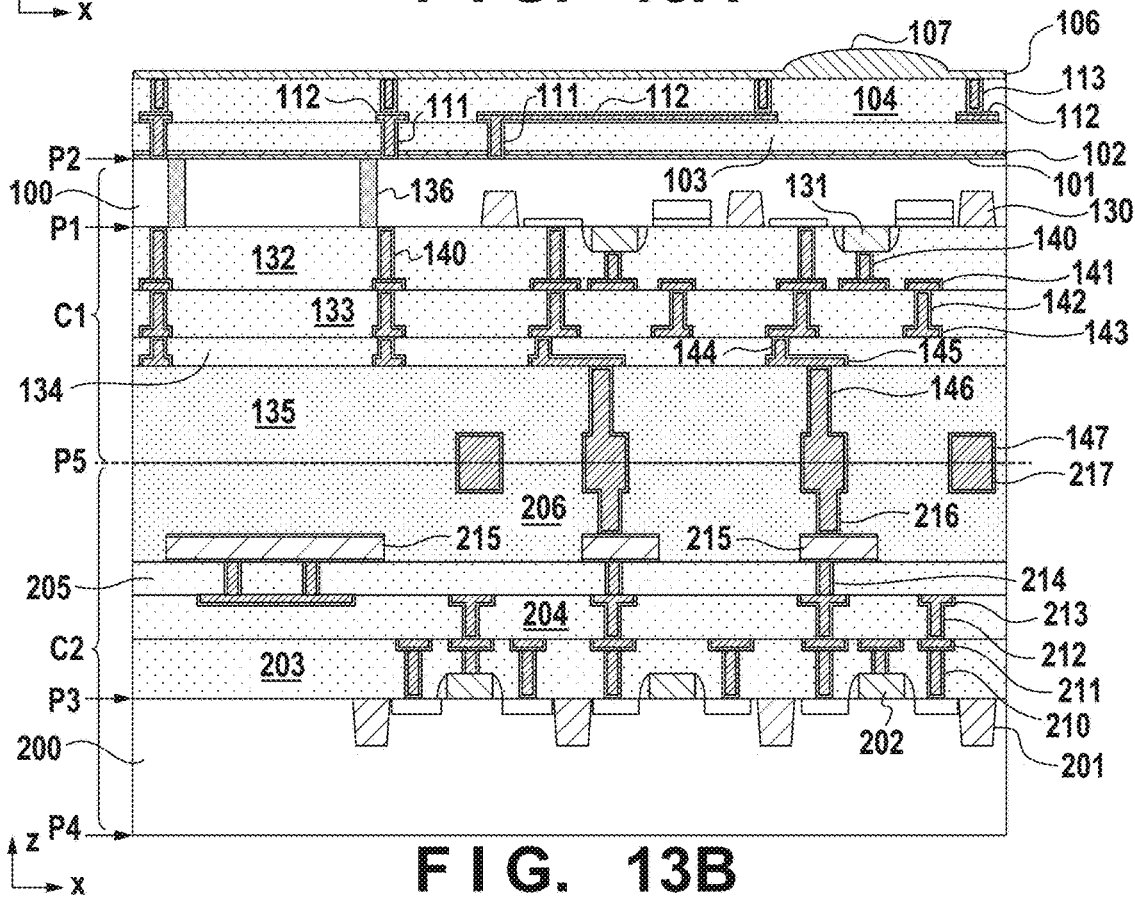

Referring to FIG. 13B, a member is formed to cover the film 104 and the via plug 113, and the film 106 including the lens portion 107 is formed. The film 106 and the lens portion 107 can be formed by etching part of the member using a photoresist mask with a lens shape. The member can be formed by CVD.

Figure 14A:
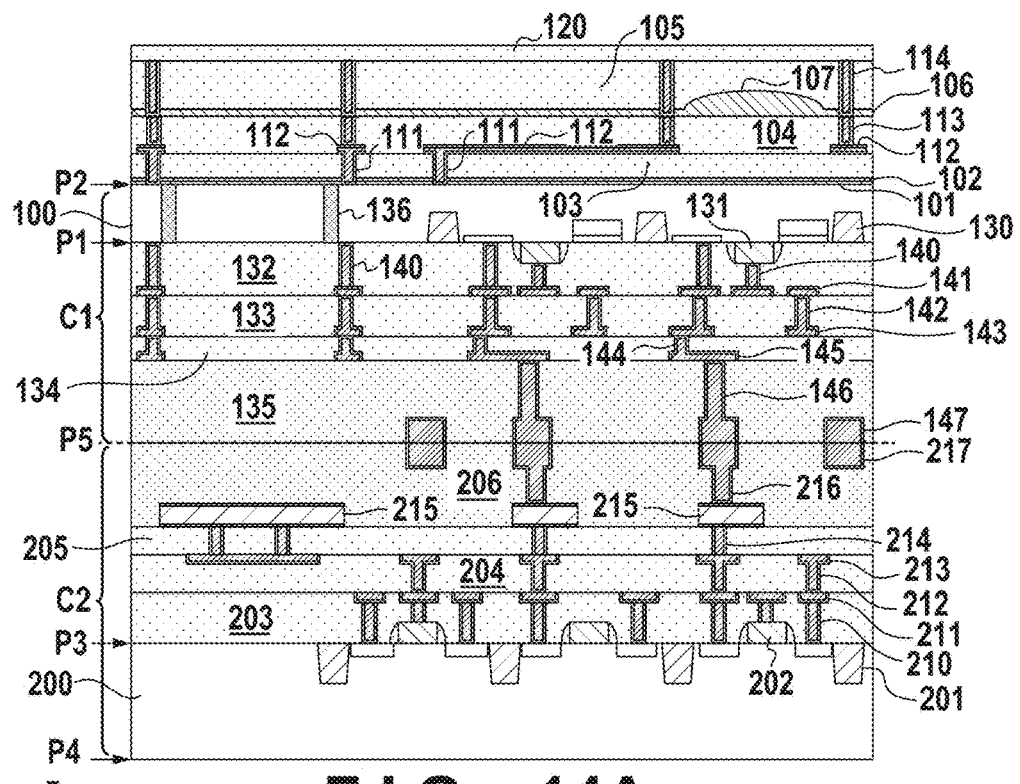
FIGS. 14A and 14B are schematic sectional views each for explaining the method of manufacturing the photoelectric conversion apparatus according to the sixth embodiment.
Figure 14B:
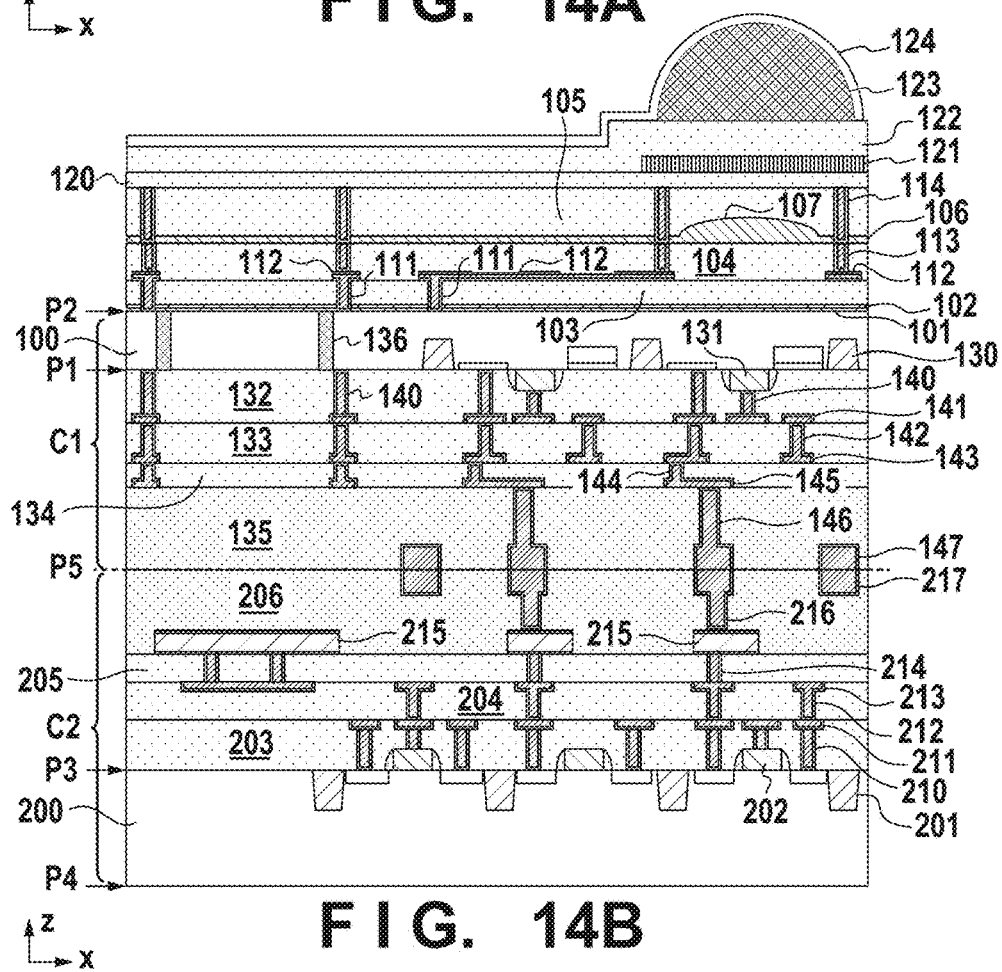

Referring to FIG. 14A, the film 105 and the via plug 114 are formed, similar to FIG. 13A. The film 120 is formed to cover the film 105 and the via plug 114. The color filter 121, the film 122, the microlens 123, and the film 124 are formed on the film 120 by the general semiconductor manufacturing method, thereby forming the arrangement shown in FIG. 14B. After that, the structure shown in FIG. 9A can be formed by forming the opening 125 for exposing the wiring layer 215 serving as a pad portion.

As the materials of the contact plug 111, the wiring layer 112, and the via plugs 113 and 114, titanium, titanium nitride, and tungsten are used. Since these elements can be formed by CVD or PVD, they can be manufactured by the same apparatus, thus achieving high productivity. In addition, since it is not necessary to form the thick film 101 by ALD, it is possible to reduce the number of steps.

In the sixth embodiment, all of the via plugs 113 and 114 and the wiring layer 112 are formed to include a metal portion made of at least one of titanium, zirconia, palladium, and magnesium. However, if such portion is arranged in at least one position, it is possible to suppress a decrease in negative bias effect.

The sixth embodiment has explained an arrangement in which one photoelectric conversion element PD is arranged in correspondence with one microlens. However, an arrangement may be adopted, in which a plurality of photoelectric conversion elements PD are arranged in correspondence with one microlens for obtaining distance information and phase difference information. In this case, in the planar view, the one microlens and the plurality of photoelectric conversion element PD are superimposed. The same applies to the lens portion 107.

Figure 15:
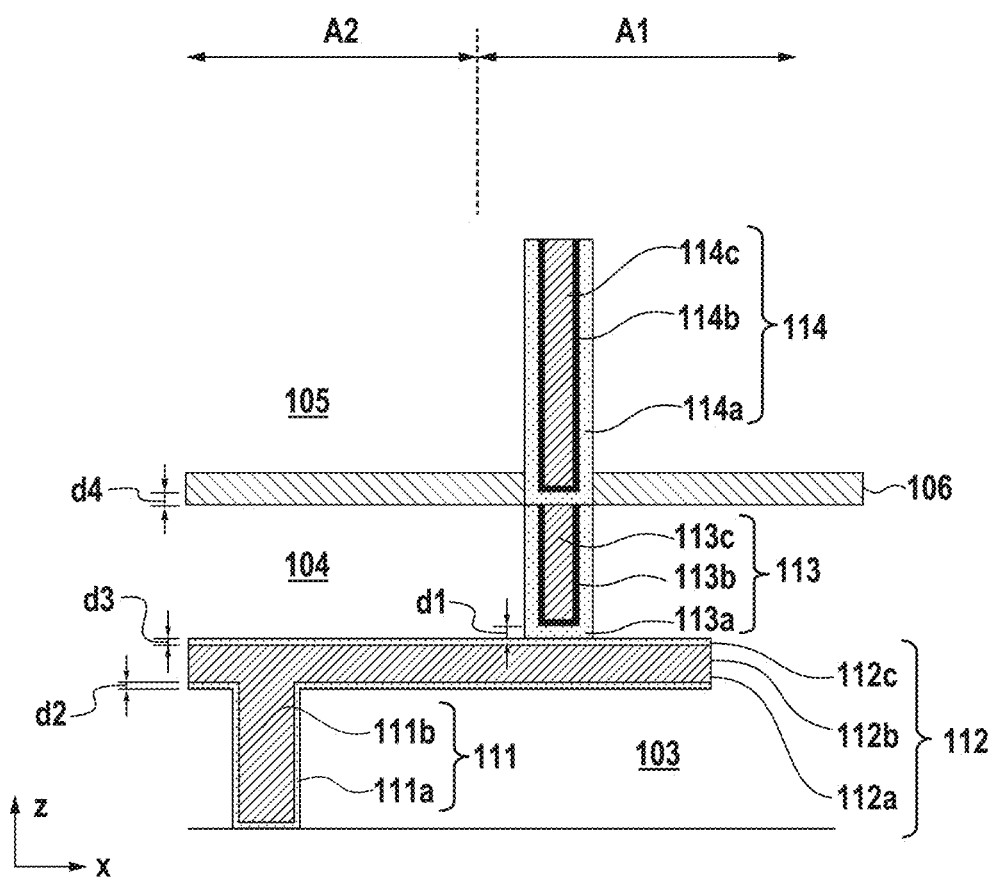
FIG. 15 is an enlarged schematic sectional view showing part of a photoelectric conversion apparatus according to the seventh embodiment.

FIG. 15 is an enlarged schematic sectional view showing part of a photoelectric conversion apparatus according to the seventh embodiment. The difference of the photoelectric conversion apparatus according to the seventh embodiment from that according to the sixth embodiment is the thickness of a metal portion. FIG. 15 is an enlarged view showing part of a contact plug 111, a wiring layer 112, via plugs 113 and 114, and films 103 to 106 corresponding to FIG. 9B. The sixth embodiment has explained the case in which the thicknesses d1, d2, d3, and d4 of the portions 113(a), 112(a), 112(c), and 114(a) are equal to each other. In the seventh embodiment, a thickness d1 is larger than thicknesses d2 and d3, and a thickness d4 is larger than the thicknesses d2 and d3.

The wiring layer 112 extends in an OB region A2. Thus, an amount of hydrogen supplied to a film 101 may be smaller than in an effective region A1. In this case, since the arrangement according to this embodiment can balance the amount of hydrogen supplied to the film 101 between the effective region A1 and the OB region A2, a variation in noise can be reduced.

Figure 16A:
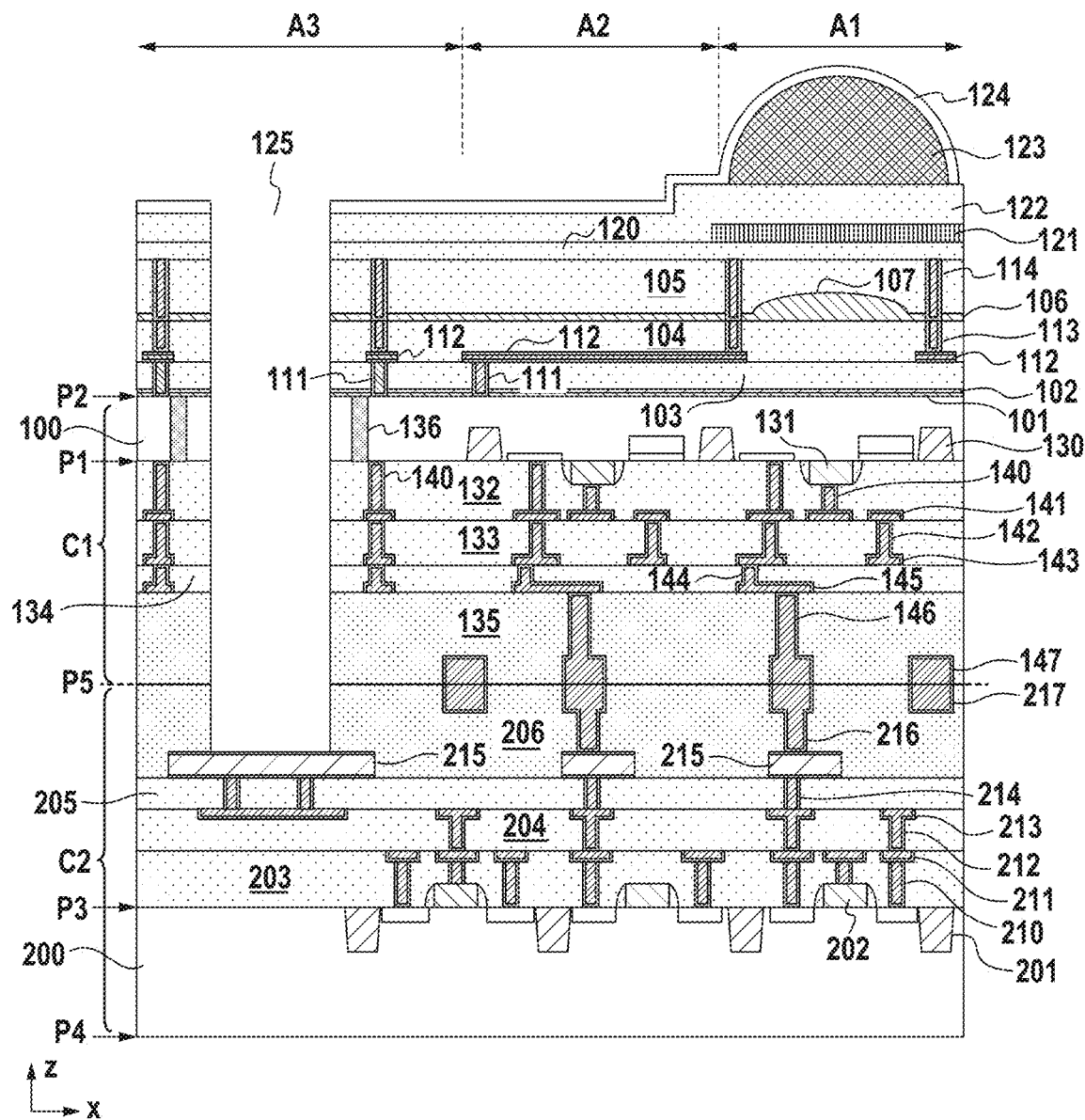
FIGS. 16A and 16B are respectively a schematic sectional view showing the photoelectric conversion apparatus according to the eighth embodiment and an enlarged schematic sectional view showing part of the photoelectric conversion apparatus according to the eighth embodiment.

FIG. 16A is a schematic sectional view showing a photoelectric conversion apparatus according to the eighth embodiment. FIG. 16A corresponds to FIG. 9A. The difference of the photoelectric conversion apparatus according to the eighth embodiment from that according to the sixth embodiment is the structures and materials of a contact plug 111 and a wiring layer 112. Details will be described with reference to FIG. 16B.

Figure 16B:
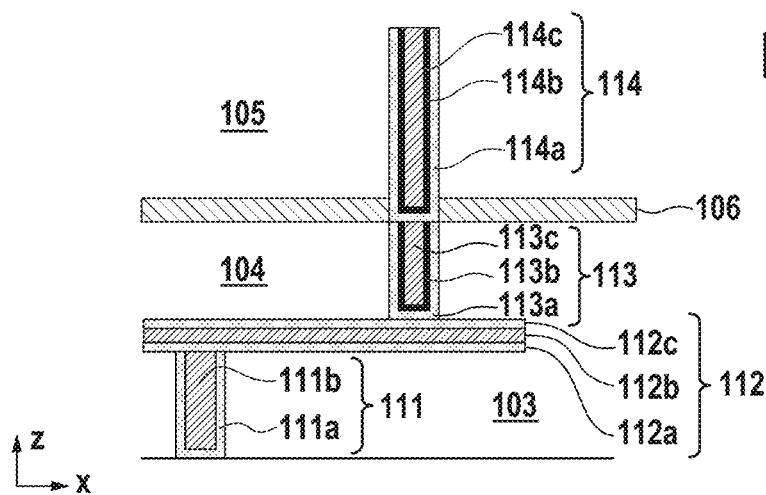

FIG. 16B is an enlarged schematic sectional view showing part of FIG. 16A, and corresponds to FIG. 9B. The contact plug 111 includes portions 111(a) and 111(b). The wiring layer 112 includes portions 112(a), 112(b), and 112(c). The portion 111(a) is a metal portion made of at least one of metals having a hydrogen storage effect such as titanium, zirconia, palladium, and magnesium, and is assumed to be made of titanium in the eighth embodiment. The portion 111(*b*) is a metal portion made of tungsten or aluminum different from the metal having the hydrogen storage effect, and is assumed to be made of tungsten in the eighth embodiment. The portions 112(*a*) and 112(*c*) are portions each made of titanium nitride or the like different from the metal having the hydrogen storage effect. The portion 112(*b*) is a portion made of aluminum different from the metal having the hydrogen storage effect. As described in the eighth embodiment, the metal having the hydrogen storage effect can be provided appropriately. Since the arrangement according to this embodiment can balance the amount of hydrogen supplied to a film 101 between the effective region A1 and the OB region A2, a variation in noise can be reduced. In addition, the portions 112(*a*) and 112(*c*) can be stacked films each including a titanium film, as needed, and the arrangement can be set appropriately. In this embodiment, the wiring layer 112 and the semiconductor layer 100 are electrically connected via a contact plug 111 including a potion 111(*b*) made of tungsten. A contact resistance between the wiring layer 112 and the semiconductor layer 100 may be lower in a case where a potion 111(*b*) is made of tungsten than in a case where a potion 111(*b*) is made of aluminum. Therefore, a combination of the wiring layer 112 including a portion 112(*b*) made of aluminum and a contact plug 111 including a potion 111(*b*) made of tungsten improve both an optical and electrical property.

Figure 17:
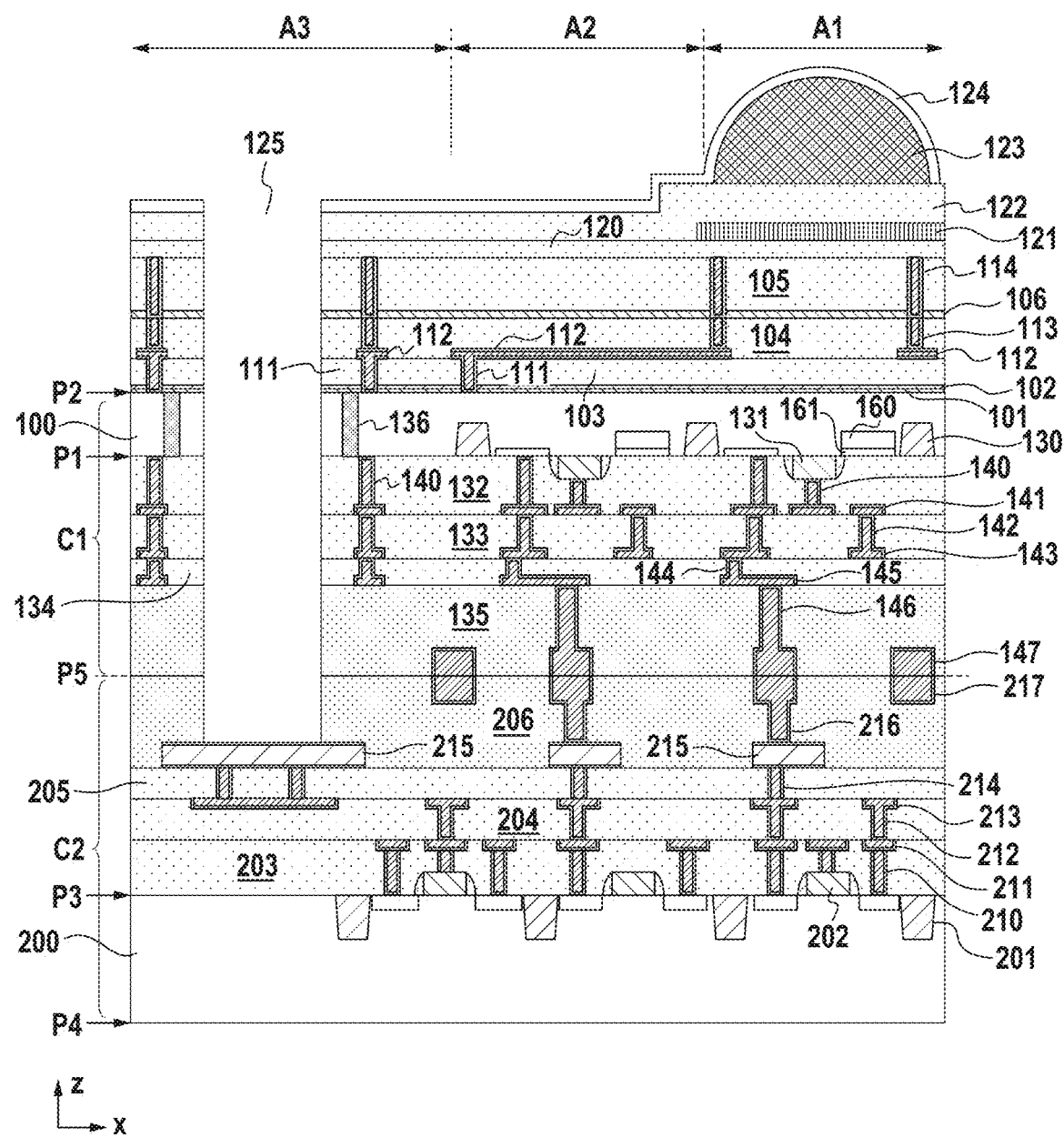
FIG. 17 is a schematic sectional view showing a photoelectric conversion apparatus according to the ninth embodiment.

FIG. 17 is a schematic sectional view showing a photoelectric conversion apparatus according to the ninth embodiment. FIG. 17 corresponds to FIG. 9A. The photoelectric conversion apparatus according to the ninth embodiment is different from that according to the sixth embodiment in that there is no lens portion 107 of the film 106. The present invention is also applicable to this arrangement.

Figure 18:
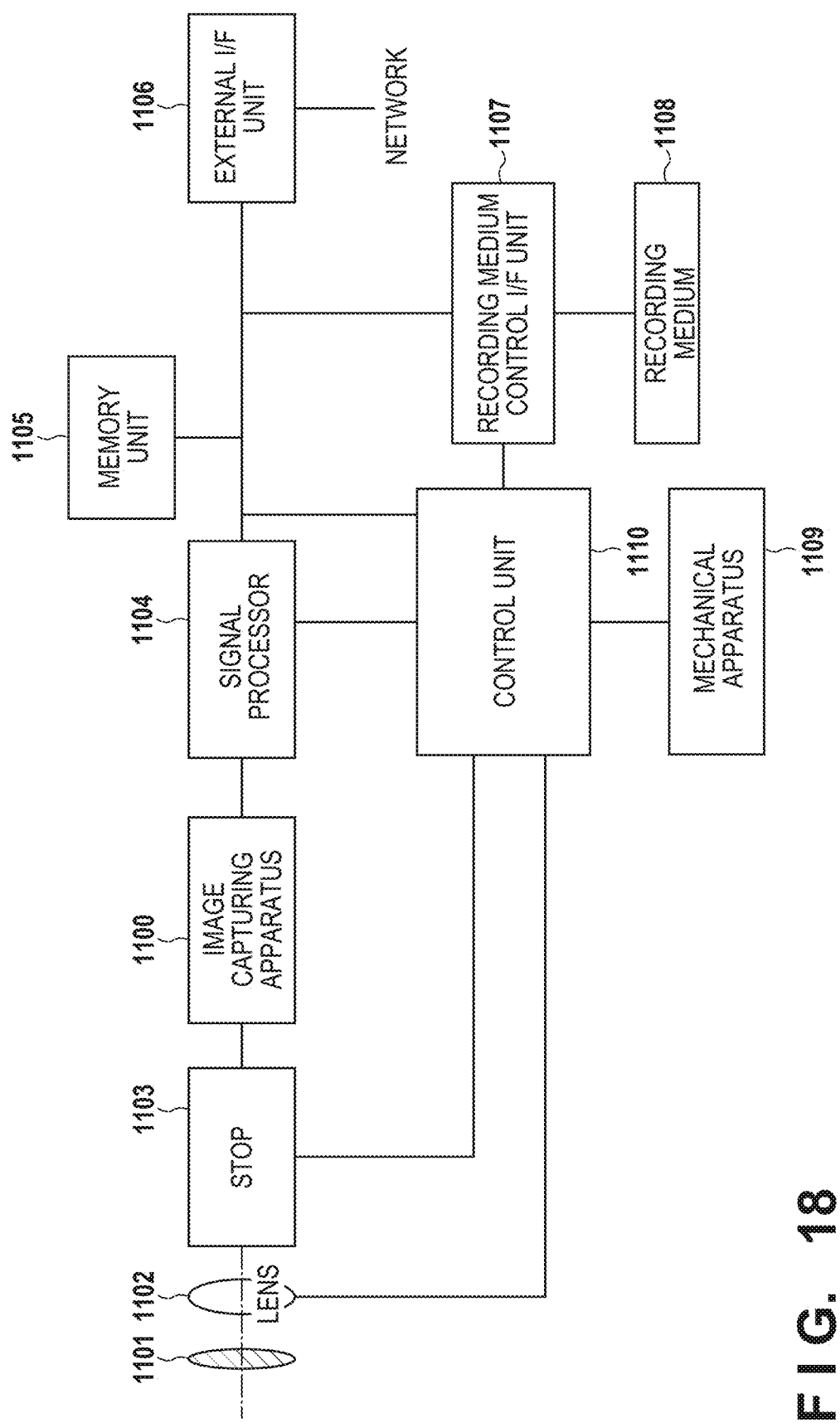
FIG. 18 is a block diagram for explaining an image capturing system according to the 10th embodiment.

FIG. 18 is a block diagram showing an image capturing system according to the 10th embodiment. The image capturing system can be a digital still camera, a digital camcorder, a camera head, a surveillance camera, a copying machine, a facsimile apparatus, a mobile terminal, a smartphone, an onboard camera, an observation satellite, an AI robot, or the like. An image capturing apparatus 1100 according to the 10th embodiment corresponds to the photoelectric conversion apparatus according to each of the first to eighth embodiments.

The image capturing system shown in FIG. 18 includes a barrier 1101, a lens 1102, a stop 1103, the image capturing apparatus 1100, and a signal processor 1104. The image capturing system also includes a memory unit 1105, an external I/F unit 1106, a recording medium control I/F unit 1107, a recording medium 1108, a mechanical apparatus 1109, and a control unit 1110. The barrier 1101 protects the lens 1102, and the lens 1102 forms an optical image of an object in the image capturing apparatus 1100. The stop 1103 changes the amount of light passing through the lens 1102. The image capturing apparatus 1100 is a CMOS (Complementary Metal Oxide Semiconductor) solid-state image capturing apparatus, and converts, into image data, the optical image formed by the lens 1102. The image capturing apparatus 1100 can include a semiconductor substrate on which a pixel circuit, a signal processing circuit, and the like are formed, a package storing the semiconductor substrate, and a connection terminal to an external circuit. On the semiconductor substrate of the image capturing apparatus 1100, an AD (Analog-to-Digital) converter is formed. The signal processor 1104 performs image processing such as tone correction and noise removal for the image data output from the image capturing apparatus 1100.

The memory unit 1105 includes a volatile memory such as a dynamic memory or a nonvolatile memory such as a flash memory, and functions as a frame memory that stores image data. The external I/F unit 1106 is a wired or wireless interface for communicating with an external computer, a network, a server, and the like. The recording medium control I/F unit 1107 is an interface for recording or reading out image data in or from the recording medium 1108. The recording medium 1108 is a detachable recording medium such as a memory card including a semiconductor memory for storing image data. The mechanical apparatus 1109 can include a driving device of an optical mechanism such as the lens 1102 and the stop 1103, and a mechanism device for, for example, controlling the orientation of the camera head. The control unit 1110 includes a CPU, a ROM, and a RAM, and controls the overall image capturing system in accordance with a predetermined program. Furthermore, the control unit 1110 can detect the movement of the object in the image data, and execute predetermined processing. Although, in FIG. 18, the signal processor 1104, the memory unit 1105, and the control unit 1110 are provided separately from the image capturing apparatus 1100, they may be formed on the same semiconductor substrate as that of the image capturing apparatus 1100.

Figure 19A:
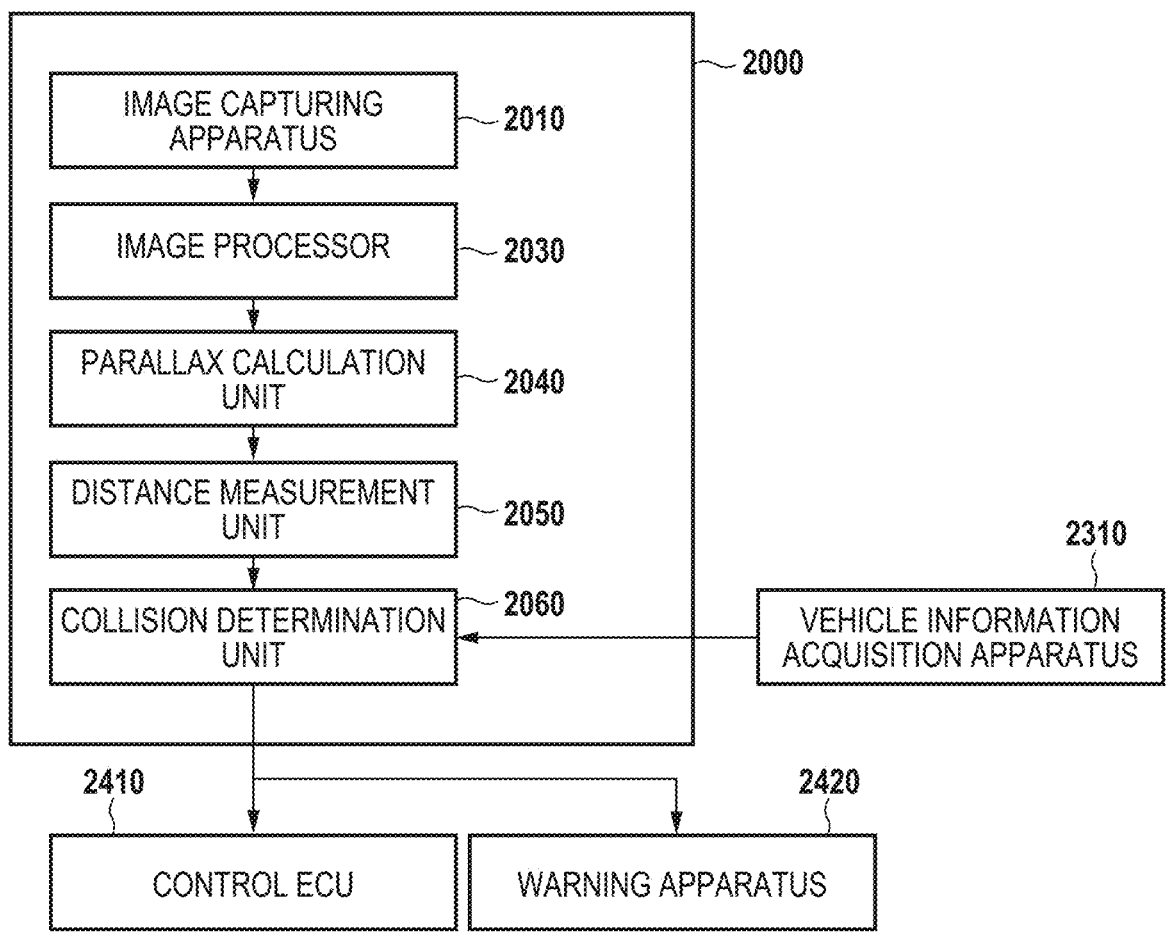
FIGS. 19A and 19B are block diagrams each for explaining a moving body according to the 11th embodiment.
Figure 19B:
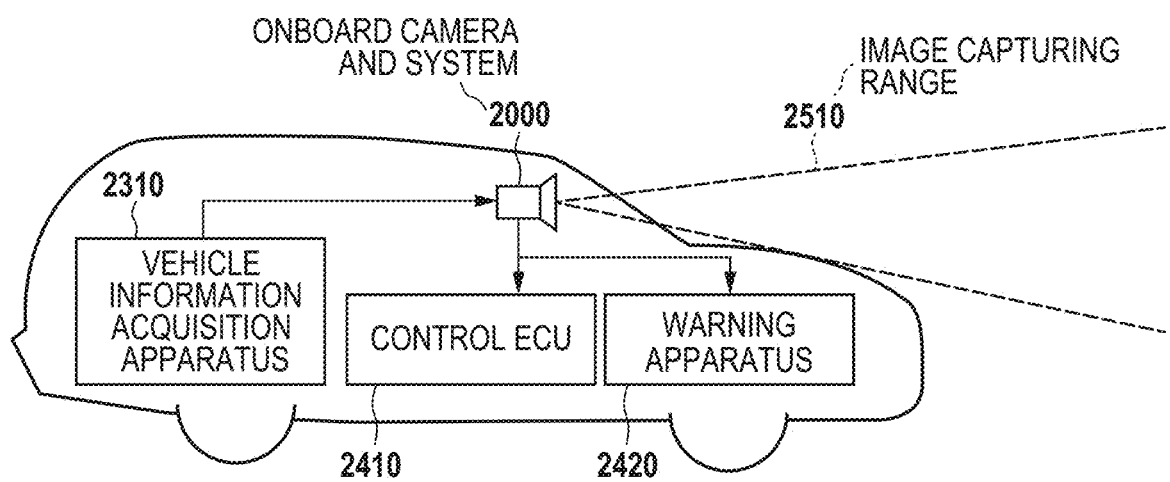

FIGS. 19A and 19B show an example of applying the photoelectric conversion apparatus according to each of the first to eighth embodiments to an image capturing system concerning an onboard camera. In this embodiment, an image capturing apparatus 2010 corresponds to the photoelectric conversion apparatus according to each of the first to eighth embodiments.

An image capturing system 2000 includes an image processor 2030 that performs image processing for a plurality of image data acquired by the image capturing apparatus 2010, and a parallax calculation unit 2040 that calculates a parallax (the phase difference of a parallax image) from the plurality of image data acquired by the image capturing system 2000. The image capturing system 2000 also includes a distance measurement unit 2050 that calculates the distance to a target object based on the calculated parallax, and a collision determination unit 2060 that determines based on the calculated distance whether there is the possibility of a collision. Here, the parallax calculation unit 2040 and the distance measurement unit 2050 are examples of a distance information acquisition means that acquires the distance information to a target object. That is, the distance information is information about a parallax, a defocus amount, a distance to a target object, or the like. The collision determination unit 2060 may determine the possibility of a collision using one of these pieces of distance information. The distance information acquisition means may be implemented by specially designed hardware or a software module. Alternatively, the distance information acquisition means may be implemented by an FPGA (Field Programmable Gate Array) or an ASIC (Application Specific Integrated Circuit) or may be implemented by a combination thereof.

The image capturing system 2000 is connected to a vehicle information acquisition apparatus 2310 and can acquire vehicle information such as a vehicle speed, a yaw rate, and a steering angle. The image capturing system 2000 is also connected to a control ECU 2410 that is a control apparatus configured to output a control signal to generate a braking force to the vehicle based on the determination result of the collision determination unit 2060. In addition, the image capturing system 2000 is also connected to a warning apparatus 2420 that generates a warning to a driver based on the determination result of the collision determination unit 2060. For example, if the possibility of a collision is high as the determination result of the collision determination unit 2060, the control ECU 2410 performs vehicle control to avoid a collision or reduce damage by, for example, applying the brake, returning the accelerator, or suppressing the engine output. The warning apparatus 2420 warns the user by, for example, generating a warning sound or the like, displaying warning information on the screen of a car navigation system or the like, or giving a vibration to a seat belt or steering wheel. The image capturing system 2000 functions as a control means that controls an operation of controlling the vehicle, as described above.

In the 11th embodiment, the image capturing system 2000 captures the periphery, for example, the front or rear of the vehicle. FIG. 19B shows the image capturing system in a case in which the front of the vehicle (image capturing range 2510) is captured. The vehicle information acquisition apparatus 2310 serving as an image capturing control means sends an instruction to the image capturing system 2000 or the image capturing apparatus 2010. This arrangement can improve the accuracy of distance measurement.

An example in which control is performed not to cause a collision against another vehicle has been described above. However, the image capturing system can also be applied to control for automated driving following another vehicle or automated driving without deviation from a lane. The image capturing system can be applied not only to a vehicle such as a self-vehicle but also to, for example, a moving body (moving apparatus) such as a ship, an airplane, or an industrial robot. In addition, the image capturing system can also be applied not only to a moving body but also to equipment that widely uses object recognition, such as ITS (Intelligent Transport Systems).

The sixth to 11th embodiments are compatible with the first, second, and fifth embodiments. That is, the wiring layer 112 in each of the sixth to 11th embodiments corresponds to the light-shielding film 50 in each of the first and second embodiments or the light-shielding film 520 in the fifth embodiment. The via plug 113 in each of the sixth to 11th embodiments corresponds to the portion 601 of the light-shielding wall 60 in the first embodiment, the first light-shielding wall layer 61 of the portion 601 of the light-shielding wall 60 in the second embodiment, or the light-shielding portion 531 in the fifth embodiment. The via plug 114 in each of the sixth to 11th embodiments corresponds to the second light-shielding wall layer 62 of the portion 601 of the light-shielding wall 60 in the second embodiment.

The present invention exemplarily described as each of the sixth to 11th embodiments can include the following aspects.

(Aspect 1)

According to aspect 1, there is provided a photoelectric conversion apparatus including a semiconductor layer having a first photoelectric conversion element, a microlens configured to condense light to the first photoelectric conversion element, a first insulating film arranged between the microlens and the first photoelectric conversion element, and a fixed charge film arranged between the first photoelectric conversion element and the first insulating film and having a charge of the same conductivity type as a conductivity type of a charge generated in the first photoelectric conversion element, the photoelectric conversion apparatus comprising a first metal portion arranged between the first insulating film and the fixed charge film, including an aperture corresponding to the first photoelectric conversion element, and being made of at least one of titanium, zirconia, palladium, and magnesium.

(Aspect 2)

According to aspect 2, there is provided the photoelectric conversion apparatus specified as aspect 1, wherein the first metal portion is made of titanium.

(Aspect 3)

According to aspect 3, there is provided the photoelectric conversion apparatus specified as aspect 1 or 2, further comprising:

a second insulating film arranged between the first insulating film and the fixed charge film; and a first plug arranged in the second insulating film, wherein the first metal portion forms the first plug.

(Aspect 4)

According to aspect 4, there is provided the photoelectric conversion apparatus specified as aspect 3, further comprising:

a third insulating film arranged between the second insulating film and the fixed charge film; and a first wiring arranged between the second insulating film and the third insulating film and including an aperture corresponding to the first photoelectric conversion element, wherein the first wiring includes a second metal portion made of at least one of titanium, zirconia, palladium, and magnesium.

(Aspect 5)

According to aspect 5, there is provided the photoelectric conversion apparatus specified as aspect 3 or 4, wherein the semiconductor layer includes a second photoelectric conversion element configured to generate a reference signal, the fixed charge film, the first insulating film, and the second insulating film are arranged from a first region where the first photoelectric conversion element is arranged to a second region where the second photoelectric conversion element is arranged, a second wiring arranged in the second region and between the second insulating film and the fixed charge film is included, and the second wiring includes a third metal portion made of a metal different from titanium, zirconia, palladium, and magnesium.

(Aspect 6)

According to aspect 6, there is provided the photoelectric conversion apparatus specified as aspect 5, wherein the third metal portion is made of tungsten or aluminum.

(Aspect 7)

According to aspect 7, there is provided the photoelectric conversion apparatus specified as aspect 5 or 6, wherein the second wiring includes a fourth metal portion made of at least one of titanium, zirconia, palladium, and magnesium, and a thickness of the fourth metal portion is smaller than a thickness of the first metal portion.

(Aspect 8)

According to aspect 8, there is provided the photoelectric conversion apparatus specified as aspect 1 or 2, further comprising:

a second insulating film arranged between the first insulating film and the fixed charge film;

a third insulating film arranged between the second insulating film and the fixed charge film; and a first wiring arranged between the second insulating film and the third insulating film and including an aperture corresponding to the first photoelectric conversion element, wherein the first metal portion forms the first wiring.

(Aspect 9)

According to aspect 9, there is provided the photoelectric conversion apparatus specified as any one of aspects 1 to 8, wherein the semiconductor layer includes a first surface and a second surface on an opposite side of the first surface, the second surface is located between the fixed charge film and the first surface, and in a planar view on the second surface, the first metal portion surrounds the first photoelectric conversion element.

(Aspect 10)

According to aspect 10, there is provided the photoelectric conversion apparatus specified as aspect 9, wherein the semiconductor layer includes a third photoelectric conversion element, in the planar view, the microlens is superimposed on the first photoelectric conversion element and the third photoelectric conversion element, and the first metal portion surrounds a region where the first photoelectric conversion element and the third photoelectric conversion element are arranged.

(Aspect 11)

According to aspect 11, there is provided the photoelectric conversion apparatus specified as any one of aspects 1 to 10, further comprising a third wiring configured to transmit a signal based on the charge generated in the first photoelectric conversion element, wherein the semiconductor layer is located between the fixed charge film and the third wiring.

(Aspect 12)

According to aspect 12, there is provided the photoelectric conversion apparatus specified as aspect 11, further comprising a second semiconductor layer and a fourth wiring, wherein the third wiring and the fourth wiring are located between the second semiconductor layer and the semiconductor layer.

(Aspect 13)

According to aspect 13, there is provided the photoelectric conversion apparatus specified as any one of aspects 1 to 12, wherein the first insulating film includes a silicon nitride film.

(Aspect 14)

According to aspect 14, there is provided the photoelectric conversion apparatus specified as any one of aspects 1 to 13, wherein the first insulating film includes a lens portion configured to condense light to the first photoelectric conversion element.

(Aspect 15)

According to aspect 15, there is provided the photoelectric conversion apparatus specified as any one of aspects 1 to 14, wherein the fixed charge film is made of a material selected from the group consisting of a hafnium oxide film, an aluminum oxide film, a zirconium oxide film, a niobium oxide film, a titanium oxide film, and a vanadium oxide film.

(Aspect 16)

According to aspect 16, there is provided an image capturing system comprising:

a photoelectric conversion apparatus specified as any one of aspects 1 to 15; and a processing circuit configured to process a signal from the photoelectric conversion apparatus.

(Aspect 17)

According to aspect 17, there is provided a moving body including a photoelectric conversion apparatus specified as any one of aspects 1 to 15, and distance information acquisition means for acquiring distance information to a target object from a parallax image based on a signal from the photoelectric conversion apparatus, the moving body comprising control means for controlling the moving body based on the distance information.

The present invention is not limited to the above embodiments, and various changes and modifications can be made without departing from the spirit and scope of the present invention. For example, a plurality of embodiments may be combined, a given embodiment may be replaced by another embodiment, or some items of a given embodiment may be deleted. Note that contents disclosed in this specification include not only contents described in this specification but also all items that can be grasped from the accompanying drawings of this specification. The contents disclosed in this specification include a complementary set of concepts described in this specification. That is, if, for example, "A is B" is described in this specification, this specification is considered to disclose "A is not B" even if a description of "A is not B" is omitted in this specification. This is because if "A is B" is described, the inventor has studied a case in which "A is not B", as a matter of course. To apprise the public of the scope of the present invention, the following claims are made.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-025790, filed Feb. 15, 2019, Japanese Patent Application No. 2018-196075, filed Oct. 17, 2018, Japanese Patent Application No. 2019-036672, filed Feb. 28, 2019, and Japanese Patent Application No. 2019-126403, filed Jul. 5, 2019, which are hereby incorporated by reference herein in their entirety.

What is claimed is:

1. A photoelectric conversion apparatus including a light-receiving region and a light-shielded region, the apparatus comprising:

a semiconductor layer in which (a) a plurality of first photoelectric converters are arranged in the light-receiving region and (b) a plurality of second photoelectric converters are arranged in the light-shielded region;

a light-shielding wall arranged above the semiconductor layer and configured to define a plurality of apertures respectively corresponding to the plurality of first photoelectric converters; and a light-shielding film arranged above the semiconductor layer, wherein the light-shielding film includes a first portion extending along a principal surface of the semiconductor layer to cover the plurality of second photoelectric converters, the first portion having (a) a lower surface on a side of the semiconductor layer and (b) an upper surface on an opposite side of the lower surface, wherein the light-shielding wall includes a second portion whose distance from the semiconductor layer is larger than a distance between the upper surface and the principal surface, and wherein a light absorption coefficient of a material forming the light-shielding film is larger than a light absorption coefficient of a material forming the light-shielding wall.

2. The apparatus according to claim 1, wherein the light-shielding wall is made of tungsten, and
wherein the light-shielding film is made of aluminum.

3. The apparatus according to claim 1, wherein the light-shielding wall is arranged to form a matrix.

4. The apparatus according to claim 1, wherein the light-shielding wall includes a portion arranged, in orthographic projection to the principal surface, between the first photoelectric converter arranged at a position closest to the light-shielded region among the plurality of first photoelectric converters and the second photoelectric converter arranged at a position closest to the light-receiving region among the plurality of second photoelectric converters.

5. The apparatus according to claim 1, further comprising:
a plurality of on-chip lenses respectively corresponding to the plurality of first photoelectric converters; and
a plurality of on-chip lenses respectively corresponding to the plurality of second photoelectric converters.

6. The apparatus according to claim 5, further comprising an intralayer lens arranged between one of the plurality of on-chip lenses respectively corresponding to the plurality of first photoelectric converters and one of the plurality of first photoelectric converters, and an intralayer lens arranged between one of the plurality of on-chip lenses respectively corresponding to the plurality of second photoelectric converters and one of the plurality of second photoelectric converters.

7. The apparatus according to claim 1, wherein (a) the light-shielding film and the semiconductor layer are electrically connected via a portion made of tungsten, and/or (b) the light-shielding film and the semiconductor layer are electrically connected in a region different from the light-receiving region and the light-shielded region.

8. The apparatus according to claim 1, further comprising:
an insulating film arranged between the light-shielding film and the semiconductor layer; and
a metal compound film and/or metal film, the metal compound film and/or metal film being arranged between the light-shielding film and the insulating film.

9. The apparatus according to claim 1, further comprising an insulating film arranged between the light-shielding film and the semiconductor layer,
wherein the insulating film includes (a) a silicon compound layer and (b) a metal compound layer located between the silicon compound layer and the semiconductor layer.

10. The apparatus according to claim 1, further comprising a silicon nitride film and/or a silicon oxynitride film to cover the light-shielding film.

11. The apparatus according to claim 1, wherein the light-shielding wall includes (a) a first light-shielding wall layer including a plurality of apertures, and (b) a second light-shielding wall layer stacked on the first light-shielding wall layer and including a plurality of apertures.

12. The apparatus according to claim 1, wherein the light-shielding film includes a third portion configured to define a plurality of apertures respectively corresponding to the plurality of first photoelectric converters and located between the second portion and the semiconductor layer.

13. The apparatus according to claim 12, further comprising a metal film and/or metal compound film, the metal film and/or metal compound film being arranged between the second portion and the third portion.

14. The apparatus according to claim 1, further comprising a gate electrode and a wiring layer, the gate electrode and the wiring layer being arranged on an opposite side of the light-shielding film with respect to the semiconductor layer.

15. The apparatus according to claim 1, further comprising a gate electrode and a wiring layer, the gate electrode and the wiring layer being arranged between the semiconductor layer and the light-shielding film.

16. The apparatus according to claim 1, wherein the light-shielding wall is arranged in the light-receiving region and the light-shielded region, and includes a plurality of apertures respectively corresponding to the plurality of second photoelectric converters.

17. The apparatus according to claim 11, wherein in a portion of the light-receiving region, the first light-shielding wall layer and the second light-shielding wall layer are mutually shifted and arranged in the direction parallel to the principal surface.

18. A photoelectric conversion apparatus including a light-receiving region and a light-shielded region, the apparatus comprising:
a semiconductor layer in which (a) a plurality of first photoelectric converters are arranged in the light-receiving region and (b) a plurality of second photoelectric converters are arranged in the light-shielded region;
a light-shielding wall arranged above the semiconductor layer and configured to define a plurality of apertures respectively corresponding to the plurality of first photoelectric converters;
a light-shielding film arranged above the semiconductor layer;
an insulating film arranged above the semiconductor layer; and
a metal oxide film arranged between the semiconductor layer and the insulating film,
wherein the light-shielding film includes a first portion extending along a principal surface of the semiconductor layer to cover the plurality of second photoelectric converters, the first portion having (a) a lower surface on a side of the semiconductor layer and (b) an upper surface on an opposite side of the lower surface,
wherein the light-shielding wall includes a second portion whose distance from the semiconductor layer is larger than a distance between the upper surface and the principal surface,
wherein the first portion is made of aluminum,
wherein the second portion is made of tungsten,
wherein the light-shielding film is arranged between the insulating film and the metal oxide film, and
wherein at least one of the light-shielding film and the light-shielding wall includes a portion made of at least one of titanium, zirconium, palladium, and magnesium.

19. A photoelectric conversion apparatus including a light-receiving region and a light-shielded region, the apparatus comprising:
a semiconductor layer in which (a) a plurality of first photoelectric converters are arranged in the light-receiving region and (b) a plurality of second photoelectric converters are arranged in the light-shielded region;
a light-shielding wall arranged above the semiconductor layer and configured to define a plurality of apertures respectively corresponding to the plurality of first photoelectric converters;
a light-shielding film arranged above the semiconductor layer;
an insulating film arranged above the semiconductor layer; and a metal oxide film arranged between the semiconductor layer and the insulating film, wherein the light-shielding film includes a first portion extending along a principal surface of the semiconductor layer to cover the plurality of second photoelectric converters, the first portion having (a) a lower surface on a side of the semiconductor layer and (b) an upper surface on an opposite side of the lower surface, and wherein the light-shielding wall includes a second portion whose distance from the semiconductor layer is larger than a distance between the upper surface and the principal surface, wherein the first portion is made of aluminum, wherein the second portion is made of tungsten, wherein the light-shielding film is arranged between the insulating film and the metal oxide film, wherein the light-shielding film includes an aluminum portion, and wherein a titanium portion is arranged between the aluminum portion and the metal oxide film.

20. The apparatus according to claim 19, wherein a titanium portion is arranged between the insulating film and the aluminum portion.

21. The apparatus according to claim 19, further comprising:
an insulating film arranged above the semiconductor layer; and
a metal oxide film arranged between the semiconductor layer and the insulating film,
wherein the light-shielding wall is arranged in an opening of the insulating film,
wherein the light-shielding wall includes a tungsten portion, and
wherein a titanium nitride portion is arranged between the tungsten portion and the aluminum portion.

22. The apparatus according to claim 18, wherein the metal oxide film includes (a) a first metal oxide film as one of a hafnium oxide film, an aluminum oxide film, a zirconium oxide film, a niobium oxide film, a titanium oxide film, and a vanadium oxide film, and (b) a second metal oxide film as one of a tantalum oxide film and a titanium oxide film, and
wherein the first metal oxide film is arranged between the second metal oxide film and the semiconductor layer.

23. Equipment comprising:
a photoelectric conversion apparatus according to claim 1; and
at least one of (a) an optical system configured to form an optical image in the photoelectric conversion apparatus and (b) a display apparatus configured to display information obtained by the photoelectric conversion apparatus.

24. The apparatus according to claim 1, wherein the light-shielding film defines a plurality of openings corresponding to the plurality of first photoelectric converters, and has a third portion positioned between the second portion and the semiconductor layer.

25. The apparatus according to claim 1, wherein a light transmittance of the first portion in a direction perpendicular to the principal surface is lower than a light transmittance of the light-shielding wall in a direction parallel to the principal surface.

* * * * *